(12) United States Patent
Joo et al.

(10) Patent No.: US 12,501,811 B2
(45) Date of Patent: Dec. 16, 2025

(54) LIGHT EMITTING DISPLAY DEVICE THAT INCLUDES COLOR FILTER LAYER AND QUANTUM DOT LAYER

(71) Applicant: Samsung Display Co., Ltd., Yongin-Si (KR)

(72) Inventors: Sun-Kyu Joo, Suwon-si (KR); Keunchan Oh, Hwaseong-si (KR); Jae Cheol Park, Hwaseong-si (KR); Hyeokjin Lee, Seongnam-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 415 days.

(21) Appl. No.: 18/102,795

(22) Filed: Jan. 30, 2023

(65) Prior Publication Data
US 2023/0320162 A1  Oct. 5, 2023

(30) Foreign Application Priority Data
Mar. 30, 2022  (KR) .................. 10-2022-0039578

(51) Int. Cl.
*H10K 59/38* (2023.01)
*H10K 59/80* (2023.01)

(52) U.S. Cl.
CPC ........... *H10K 59/38* (2023.02); *H10K 59/877* (2023.02)

(58) Field of Classification Search
None
See application file for complete search history.

(56) References Cited

U.S. PATENT DOCUMENTS

| | | | |
|---|---|---|---|
| 7,817,227 B2 | 10/2010 | Lee et al. | |
| 10,263,220 B2 | 4/2019 | Liu | |
| 10,692,417 B2 | 6/2020 | Lee et al. | |
| 11,165,049 B2 | 11/2021 | Joo et al. | |
| 11,228,012 B2 | 1/2022 | Lee et al. | |
| 2005/0093435 A1* | 5/2005 | Suh | H10K 59/38 313/506 |
| 2010/0219429 A1* | 9/2010 | Cok | H10K 50/865 257/89 |
| 2017/0076678 A1* | 3/2017 | Lee | G02F 1/1336 |

(Continued)

FOREIGN PATENT DOCUMENTS

| | | |
|---|---|---|
| KR | 10-1335276 B1 | 11/2013 |
| KR | 10-2018-0074644 A | 7/2018 |

(Continued)

*Primary Examiner* — Nduka E Ojeh
(74) *Attorney, Agent, or Firm* — Innovation Counsel LLP

(57) ABSTRACT

A display device is disclosed that includes a display element layer, a circuit element layer, and a light control layer. The display element layer is disposed above a base layer and includes first, second, and third light emitting elements providing source light to first, second, and third light emitting regions, respectively, toward the base layer. The circuit element layer is disposed between the base layer and the display element layer. The light control layer is disposed between the display element layer and the circuit element layer and includes a color filter layer and a quantum dot layer. The color filter layer includes first, second, and third color filters and the quantum dot layer is disposed on the color filter layer and includes quantum dots that overlap the first light emitting region and first, second, and third pixel circuits.

28 Claims, 21 Drawing Sheets

(56) References Cited

U.S. PATENT DOCUMENTS

| | | |
|---|---|---|
| 2019/0163016 A1 | 5/2019 | Kim et al. |
| 2020/0105855 A1* | 4/2020 | Lee ........................ H10K 50/82 |
| 2020/0106041 A1* | 4/2020 | Lee ................... H10K 59/80515 |
| 2021/0249478 A1 | 8/2021 | Oh et al. |
| 2021/0391558 A1 | 12/2021 | Kim et al. |
| 2021/0408137 A1* | 12/2021 | Lee ...................... H10K 59/353 |

FOREIGN PATENT DOCUMENTS

| | | |
|---|---|---|
| KR | 10-2019-0000759 A | 1/2019 |
| KR | 10-2019-0061744 A | 6/2019 |
| KR | 10-2020-0036235 A | 4/2020 |
| KR | 10-2020-0044233 A | 4/2020 |
| KR | 10-2020-0054382 A | 5/2020 |
| KR | 10-2021-0101380 A | 8/2021 |

* cited by examiner

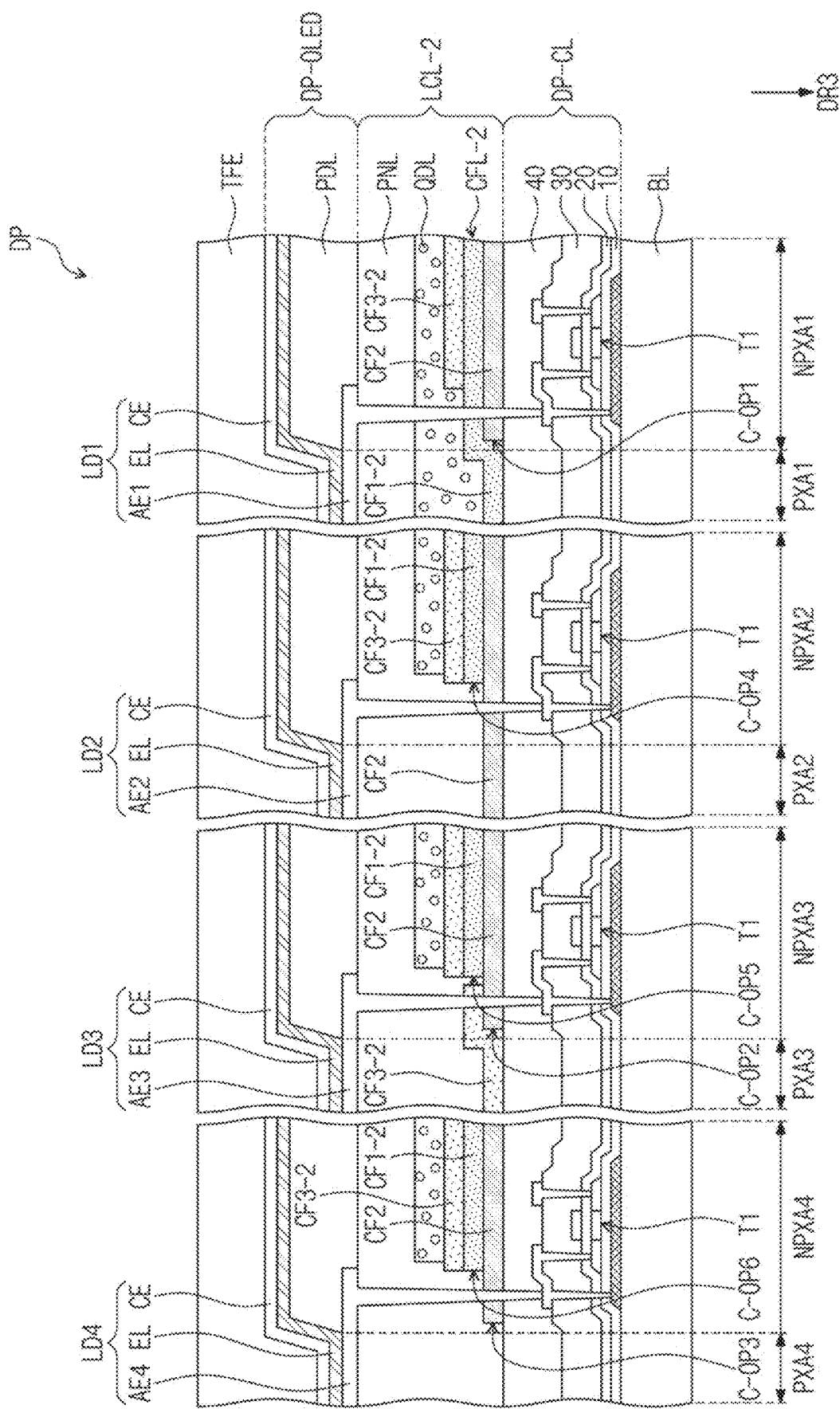

LIGHT EMITTING DISPLAY DEVICE THAT INCLUDES COLOR FILTER LAYER AND QUANTUM DOT LAYER

CROSS-REFERENCE TO RELATED APPLICATIONS

This U.S. non-provisional patent application claims priority under 35 U.S.C. § 119 of Korean Patent Application No. 10-2022-0039578, filed on Mar. 30, 2022, the entire contents of which are hereby incorporated by reference.

BACKGROUND

The present disclosure relates to a display device, and more particularly, to a display device having improved display quality.

Multimedia display devices such as televisions, mobile phones, tablet, computers, navigation devices, and game consoles include display panels for displaying images. Display panels may include a plurality of pixels for displaying an image, and each of the pixels may include a light emitting element for generating light and a circuit element connected to the light emitting element.

In a display device, the light emitting element provides one type of source light, and the source light may be provided as light having various colors after passing through color filters. In this case, some of the light having various colors is emitted with a wavelength band having a wide full width at half maximum causing deteriorated color reproducibility. This may cause deterioration in display quality of the display device

SUMMARY

The present disclosure may provide a display device that exhibits improved display quality with enhanced color purity and color reproducibility.

An embodiment of a display device includes: a base layer which includes first, second, and third light emitting regions and a non-light emitting region that surrounds the first, second, and third light emitting regions; a display element layer which is disposed above the base layer and includes first, second, and third light emitting elements that provide source light to the first, second, and third light emitting regions, respectively, toward the base layer; a circuit element layer which is disposed between the base layer and the display element layer and includes first, second, and third pixel circuits that are connected to the first, second, and third light emitting elements, respectively, wherein the first, second, and third pixel circuits overlap the non-light emitting region and are spaced apart from the first, second, and third light emitting regions; and a light control layer which is disposed between the display element layer and the circuit element layer and includes a color filter layer and a quantum dot layer, wherein the color filter layer includes first, second, and third color filters that overlap the first, second, and third light emitting regions, respectively, wherein the quantum dot layer is disposed on the color filter layer, includes quantum dots, and overlaps the first light emitting region and the first, second, and third pixel circuits.

In an embodiment, the first, second, and third color filters may allow first, second, and third color light having different colors to pass therethrough, respectively, and the quantum dots may convert at least a portion of the source light, which is provided from the first light emitting element, into the first color light.

In an embodiment, a control opening, which overlaps the second and third light emitting regions, may be defined in the quantum dot layer.

In an embodiment, the light control layer further may include an organic pattern layer which is disposed on a region of the color filter layer exposed from the quantum dot layer, overlaps the second and third light emitting regions, and includes an organic material and scattering agents dispersed in the organic material, wherein the organic pattern layer includes: a first organic pattern overlapping the second light emitting region; and a second organic pattern overlapping the third light emitting region.

In an embodiment, the first color light may be any one of red light or green light.

In an embodiment, the source light may include the second and third color light.

In an embodiment, the source light further may include the first color light.

In an embodiment, the quantum dot layer may further include additional quantum dots that convert at least a portion of the source light, which is provided from the first light emitting element, into the third color light, and each of a wavelength of the first color light and a wavelength of the third color light may be longer than a wavelength of the second color light.

In an embodiment, the source light may include the second color light.

In an embodiment, the source light further may include at least one of the first color light or the third color light.

In an embodiment, the quantum dot layer may overlap the second and third light emitting regions.

In an embodiment, an area of the second light emitting region may be greater than an area of the first light emitting region and an area of the third light emitting region.

In an embodiment, the quantum dot layer may further include scattering agents.

In an embodiment, the quantum dot layer may overlap the second light emitting region and may not overlap the third light emitting region.

In an embodiment, the base layer may further include a fourth light emitting region, the display element layer further may include a fourth light emitting element that provides the source light to the fourth light emitting region toward the base layer, the circuit element layer may further include a fourth pixel circuit which is connected to the fourth light emitting element and spaced apart from the fourth light emitting region and overlaps the non-light emitting region, the color filter layer may not overlap the fourth light emitting region, and the quantum dot layer may overlap the fourth pixel circuit.

In an embodiment, a control opening, which overlaps the second to fourth light emitting regions, may be defined in the quantum dot layer.

In an embodiment, the quantum dot layer may further include additional quantum dots that convert at least a portion of the source light, which is provided from the first light emitting element, into the third color light, and the quantum dot layer may overlap the second to fourth light emitting regions.

In an embodiment, the quantum dot layer may further include additional quantum dots that convert at least a portion of the source light, which is provided from the first light emitting element, into the third color light, and the quantum dot layer may not overlap the second and fourth light emitting regions.

In an embodiment, the second color filter may overlap at least a portion of each of the first, second, and third pixel circuits.

In an embodiment, at least one of the first or third color filter may overlap at least a portion of each of the first, second, and third pixel circuits and may be disposed on the second filter in the non-light emitting region.

In an embodiment, scattering agents may be dispersed in at least one of the second or third color filter.

In an embodiment, the light control layer may further include a planarization layer disposed between the quantum dot layer and the display element layer, wherein the planarization layer covers the quantum dot layer and includes an organic material.

In an embodiment, the planarization layer may further include scattering agents.

An embodiment of a display device includes: a base layer which includes first, second, and third light emitting regions and a non-light emitting region that surrounds the first, second, and third light emitting regions; a display element layer which is disposed above the base layer and includes first, second, and third light emitting elements that provide source light to the first, second, and third light emitting regions, respectively, toward the base layer; a circuit element layer which is disposed between the base layer and the display element layer and includes first, second, and third pixel circuits that are connected to the first, second, and third light emitting elements, respectively, wherein the first, second, and third pixel circuits overlap the non-light emitting region and are spaced apart from the first, second, and third light emitting regions; and a light control layer which is disposed between the display element layer and the circuit element layer and includes a color filter layer and a quantum dot layer, wherein the color filter layer includes a first color filter overlapping the first light emitting region, a second color filter overlapping the second light emitting region and entirely overlapping the first, second, and third pixel circuits, and a third color filter overlapping the third light emitting region, wherein the quantum dot layer is disposed on the color filter layer, includes quantum dots, and overlaps the first light emitting region.

In an embodiment, the first, second, and third color filters may allow first, second, and third color light having different colors to pass therethrough, respectively, the quantum dots may convert at least a portion of the source light, which is provided from the first light emitting element, into the first color light, and the first color light may be any one of red light or green light.

In an embodiment, a control opening, which overlaps the second and third light emitting regions, may be defined in the quantum dot layer.

In an embodiment, the quantum dot layer may further include additional quantum dots that convert at least a portion of the source light, which is provided from the first light emitting element, into the third color light, a wavelength of the third color light may be longer than a wavelength of the second color light, and the quantum dot layer may overlap the second and third light emitting regions.

In an embodiment, the quantum dot layer may further include additional quantum dots that convert at least a portion of the source light, which is provided from the first light emitting element, into the third color light, a wavelength of the third color light may be longer than a wavelength of the second color light, and the quantum dot layer may overlap the second light emitting region and may not overlap the third light emitting region.

In an embodiment, the quantum dot layer may overlap at least a portion of each of the first, second, and third pixel circuits.

In an embodiment, at least one of the first or third color filter may overlap at least a portion of each of the first, second, and third pixel circuits and may be disposed on the second color filter in the non-light emitting region.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 11 is an enlarged cross-sectional view of a partial configuration of a display panel according to an embodiment of the inventive concept;

DETAILED DESCRIPTION

Figure 1:
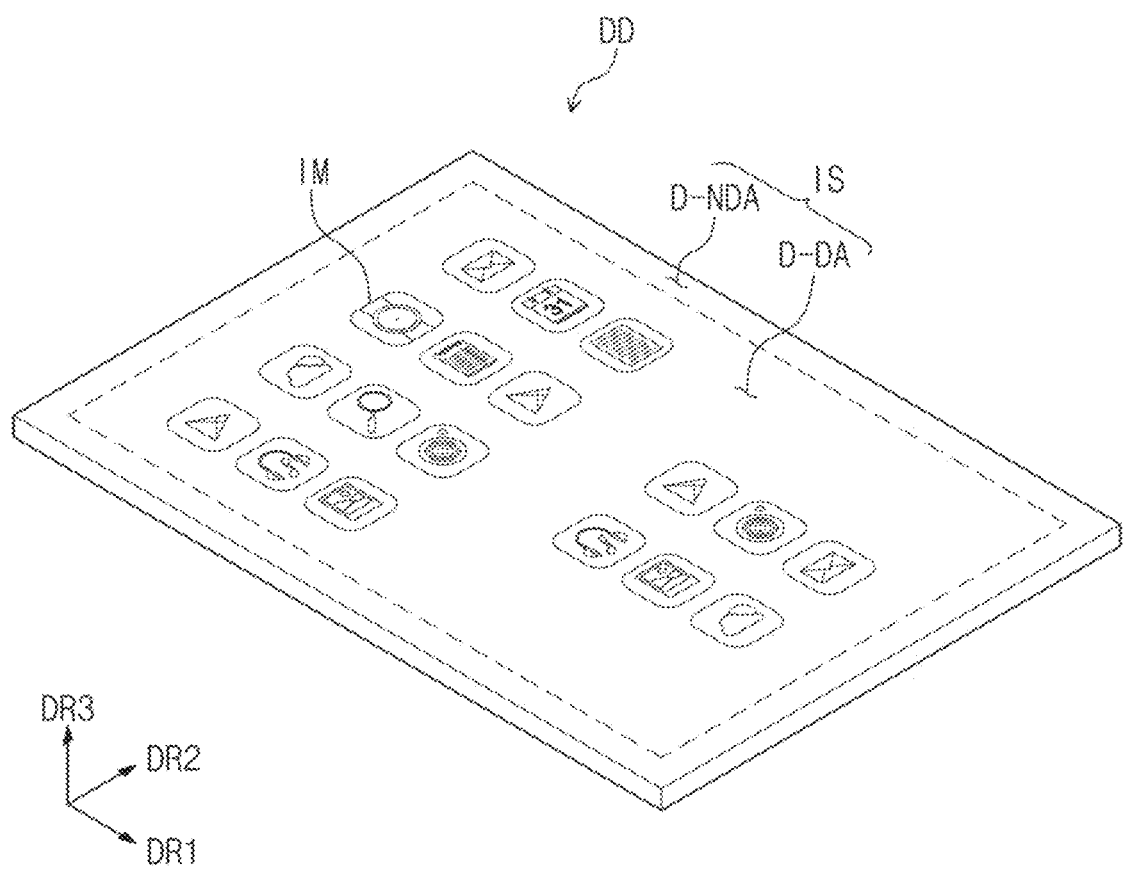
FIG. 1 is a perspective view of a display device according to an embodiment of the inventive concept.

In this specification, when an element (or a region, a layer, a portion, or the like) is referred to as "on", "connected to", or "coupled to" another element, it may be directly disposed/connected/coupled to another element, or an intervening third element may also be disposed therebetween.

Like numbers refer to like elements throughout. Also, in the drawings, the thicknesses, ratios, and dimensions of the elements are exaggerated for effective description of the technical contents.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present disclosure. The singular forms include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be understood that the term "includes" or "comprises" (and their variations such as "comprising), when used in this specification, specifies the presence of stated features, integers, steps, operations, elements, components, or a combination thereof, but does not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the present disclosure belongs. Also, terms, such as those defined in commonly used dictionaries, should be interpreted as having a meaning that is consistent with their meaning in the context of the relevant art and should not be interpreted in an idealized or overly formal sense unless expressly so defined herein.

Hereinafter, embodiments of the inventive concept will be described with reference to the drawings.

Figure 2:
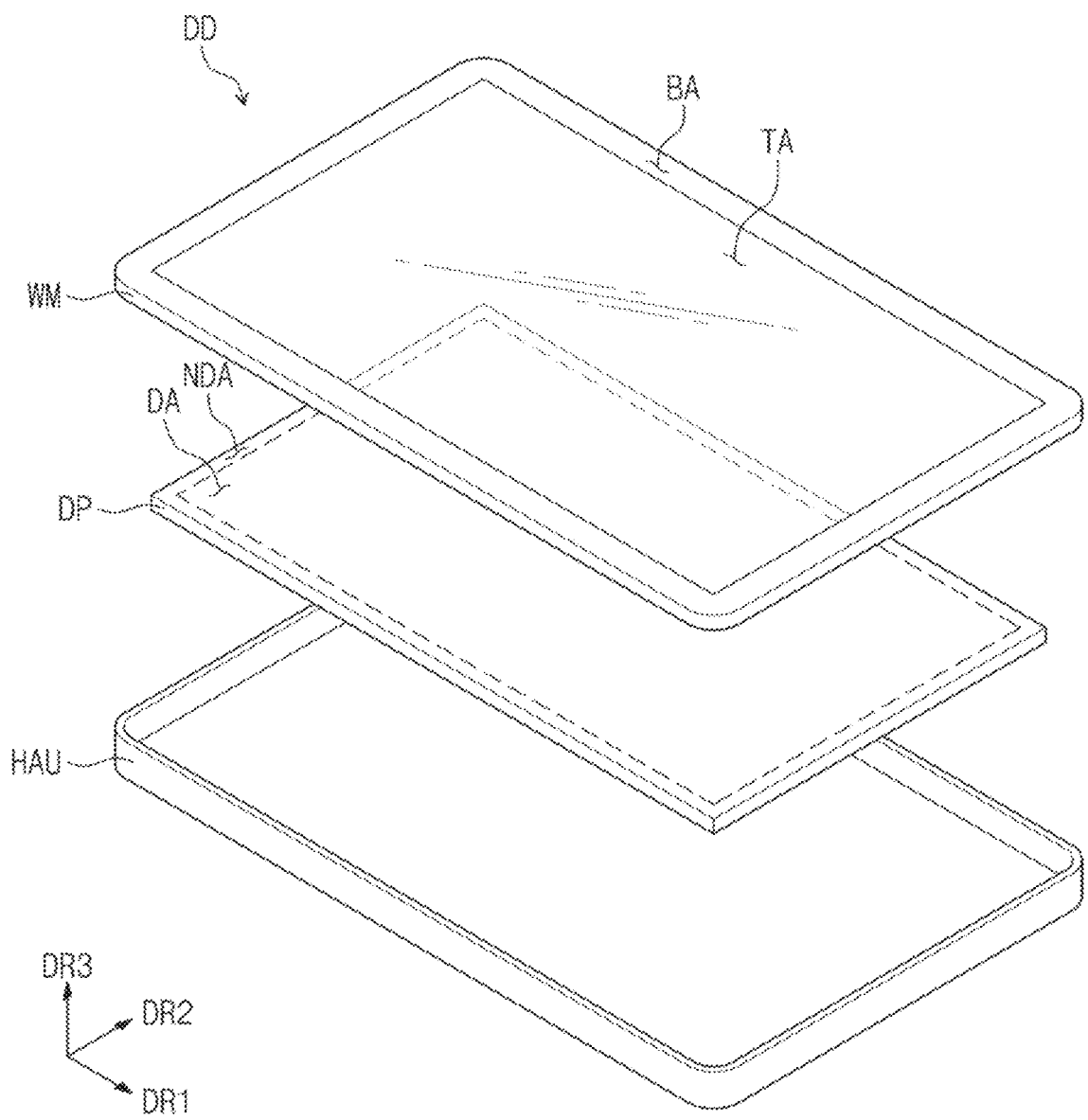
FIG. 2 is an exploded perspective view of a display device according to an embodiment of the inventive concept.

FIG. 1 is a perspective view of a display device according to an embodiment of the inventive concept. FIG. 2 is an exploded perspective view of a display device according to an embodiment of the inventive concept.

A display device DD may be a device which is activated in response to an electrical signal and displays an image. The display device DD may include various embodiments that provide a user with an image. For example, display devices DD may be large scale devices such as a television and an outdoor advertising board and also small-to-medium devices such as a monitor, a mobile phone, a tablet, a computer, a navigation unit, and a game console. Here, embodiments of the display device DD are provided as examples, and are not limited to any one example as long as not departing from the inventive concept.

Referring to FIG. 1, the display device DD may have a rectangular shape of which the long sides extend in a first direction DR1 and the short sides extend in a second direction DR2 on a plane. However, the embodiment of the inventive concept is not limited thereto, and the display device DD may have various shapes such as a circle and a polygon.

The display device DD may display an image IM in a third direction DR3 through a display surface IS parallel to a plane defined by the first direction DR1 and the second direction DR2. The third direction DR3 may be substantially parallel to the normal direction of the display surface IS. The display surface IS, on which the image IM is displayed, may correspond to the front surface of the display device DD. The image IM may include static images as well as dynamic images. FIG. 1 illustrates application icons as one example of the image IM.

In the embodiment, a front surface (or an upper surface) and a rear surface (or a lower surface) of each member or unit may be defined on the basis of the direction in which the image IM is displayed. The front and rear surfaces may be opposed to each other in the third direction DR3, and the normal direction of each of the front and rear surfaces may be parallel to the third direction DR3. A distance between the front surface and the rear surface defined in the third direction DR3 may correspond to the thickness of a member (or a unit).

In the specification, "on a plane" may be defined as a state in which the rear surface of the display device DD is viewed in the third direction DR3. In the specification, "in a cross-section" may be defined as a state which is viewed in the first direction DR1 or the second direction DR2. Here, directions indicated as the first to third directions DR1, DR2, and DR3 may have a relative concept and thus may be changed to other directions.

The display surface IS of the display device DD may include a display portion D-DA and a non-display portion D-NDA. The display portion D-DA may be a portion inside the front surface of the display device DD, on which the image IM is displayed, and a user may view the image IM through the display portion D-DA. FIG. 1 illustratively shows the display portion D-DA having a quadrangular shape on a plane, but the display portion D-DA may have various shapes according to the design of the display device DD.

The non-display portion D-NDA may be a portion inside the front surface of the display device DD, on which the image IM is not displayed. The non-display portion D-NDA may be a portion having a certain color and blocking light. The non-display portion D-NDA may be adjacent to the display portion D-DA. For example, the non-display portion D-NDA may be located outside the display portion D-DA and surround the display portion D-DA. However, this is merely illustrated as an example. The non-display portion D-NDA may be adjacent to only one side of the display portion D-DA or may be located on a side surface of the display device DD instead of the front surface thereof. The embodiment of the inventive concept is not limited thereto, and the non-display portion D-NDA may be omitted.

FIG. 1 illustrates the display device DD having a flat display surface IS as an example. The display surface IS of the display device DD is not limited to one example and may have a curved or three-dimensional shape.

The display device DD may be rigid. Or, the display device DD may be flexible. Being "flexible" may mean the characteristics of being bendable and encompass all structures from a completely foldable structure to a structure bendable to the order of several nanometers. For example, a flexible display device DD may be a curved device or a foldable device.

Referring to FIG. 2, a display device DD according to an embodiment may include a window WM, a display panel DP, and an outer case HAU.

The window WM and the outer case HAU may be coupled to each other to define the exterior of the display device DD and may provide an inner space capable of accommodating components of the display device DD such as the display panel DP.

The window WM may be disposed on the display panel DP. The window WM may protect the display panel DP from external impact. The front surface of the window WM may correspond to the display surface IS (see FIG. 1) of the display device DD described above. The front surface of the window WM may include a transmission region TA and a bezel region BA.

The transmission region TA of the window WM may be an optically transparent region. The transmission region TA of the window WM may allow an image provided from the display panel DP to pass therethrough, and a user may view the image. The transmission region TA may correspond to the display portion D-DA (see FIG. 1) of the display device DD.

The window WM may include an optically transparent insulating material. For example, the window WM may include glass, sapphire, plastic, or the like. The window WM may have a single layer or multilayer structure. The window WM may further include functional layers, such as an anti-fingerprint layer, a phase control layer, and a hard coating layer, which are disposed on an optically transparent substrate.

The bezel region BA of the window WM may be a region provided by depositing, applying, or printing a material having a certain color on a transparent substrate. The bezel region BA of the window WM may prevent a component of the display panel DP, which overlaps the bezel region BA, from being viewed from the outside. The bezel region BA may correspond to the non-display portion D-NDA (see FIG. 1) of the display device DD.

The display panel DP may be located between the window WM and the outer case HAU. The display panel DP may display an image in response to an electrical signal. The display panel DP may include a display region DA and a non-display region NDA adjacent to the display region DA.

The display region DA may be a region activated in response to an electrical signal. The display region DA may be a region through which the image provided from the display panel DP is emitted out. The display region DA of the display panel DP may overlap at least a portion of the transmission region TA. The image, which is output from the display region DA, may be viewed from the outside through the transmission region TA.

The non-display region NDA may be adjacent to the display region DA. For example, the non-display region NDA may surround the display region DA. However, the embodiment of the inventive concept is not limited thereto, and the non-display region NDA may be defined as various shapes. The non-display region NDA may be a region in which a driving circuit or driving line for driving elements arranged in the display region DA and various signal lines and pads for providing electrical signals to the elements are arranged. The non-display region NDA may overlap at least a portion of the bezel region BA, and the bezel region BA may prevent components of the display panel DP arranged in the non-display region NDA from being viewed from the outside.

The display panel DP according to an embodiment may be a light emitting-type display panel, but the embodiment of the inventive concept is not particularly limited thereto. For example, the display panel DP may be an organic light emitting display panel, an inorganic light emitting display panel, or a quantum dot light emitting display panel. A light emitting layer of the organic light emitting display panel may include an organic light emitting material, and a light emitting layer of the inorganic light emitting display panel may include an inorganic light emitting material. A light emitting layer of the quantum dot light emitting display panel may include quantum dots or quantum rods. Hereinafter, in the embodiment, the display panel DP will be described as the organic light emitting display panel.

The outer case HAU is disposed below the display panel DP and may accommodate the display panel DP. The outer case HAU may include a material having relatively high rigidity. The outer case HAU may protect the display panel DP by absorbing impact, which is applied to the display panel DP from the outside, and preventing foreign substances or moisture from entering the display panel DP. The outer case HAU according to an embodiment may be provided in a form in which a plurality of accommodation members are coupled to each other.

Figure 3:
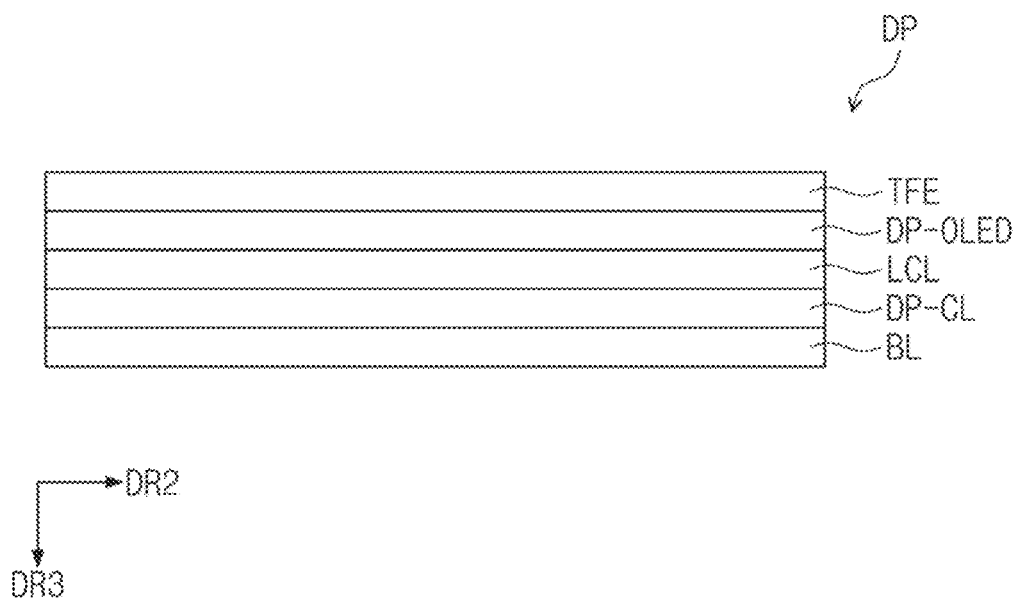
FIG. 3 is a cross-sectional view of a display panel according to an embodiment of the inventive concept.
Figure 4:
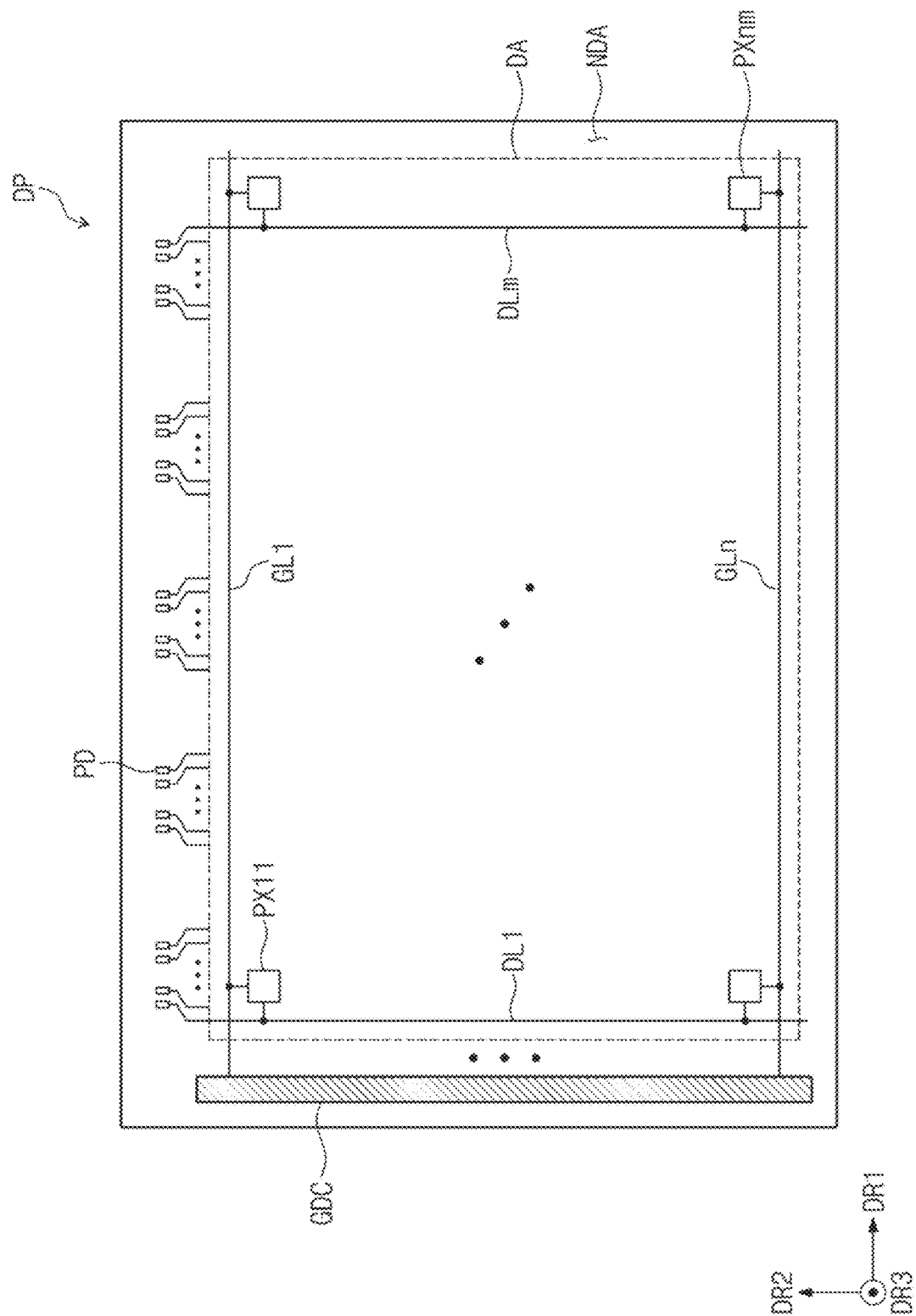
FIG. 4 is a plan view of a display panel according to an embodiment of the inventive concept.

FIG. 3 is a cross-sectional view of a display panel according to an embodiment of the inventive concept. FIG. 4 is a plan view of a display panel according to an embodiment of the inventive concept.

Referring to FIG. 3, a display panel DP according to an embodiment of the inventive concept may include a base layer BL, a circuit element layer DP-CL, a light control layer LCL, a display element layer DP-OLED, and an encapsulation layer TFE.

The base layer BL may be a base layer on which components of the display panel DP may be formed by being deposited and patterned.

The circuit element layer DP-CL may be disposed on the base layer BL. The circuit element layer DP-CL may include a driving circuit (hereinafter, a pixel circuit) of a pixel or a signal line.

The light control layer LCL may be disposed on the circuit element layer DP-CL. In an embodiment of the inventive concept, the light control layer LCL may include a quantum dot layer QDL (see FIG. 6) that may change optical characteristics of source light. Also, the light control layer LCL may include a color filter layer CFL (see FIG. 6) that allows light having a specific wavelength range among the source light to pass therethrough.

The display element layer DP-OLED may be disposed on the light control layer LCL. The display element layer DP-OLED may include a light emitting element arranged for each of pixels.

The encapsulation layer TFE may be disposed on the display element layer DP-OLED. The encapsulation layer TFE may seal the light emitting elements.

According to an embodiment of the inventive concept, the base layer BL, the circuit element layer DP-CL, the light control layer LCL, the display element layer DP-OLED, and the encapsulation layer TFE may be laminated in this order in a direction opposite to a direction in which the source light generated in the display element layer DP-OLED passes through the base layer BL.

Referring to FIG. 4, the display panel DP may include pixels PX11 to PXnm, signal lines GL1 to GLn and DL1 to DLm, a driving circuit GDC, and pads PD, which are electrically connected to the pixels PX11 to PXnm.

Each of the pixels PX11 to PXnm may include a pixel circuit that includes a light emitting element LD and a plurality of transistors (e.g., a driving transistor T1, a switching transistor T2, etc.) connected to the light emitting element LD, which will be described later in FIG. 6. The pixels PX11 to PXnm may provide light in response to electrical signals applied to the pixels PX11 to PXnm.

FIG. 4 illustrates the pixels PX11 to PXnm having the form of a matrix as an example, but the embodiment of the inventive concept is not limited thereto. For example, the pixels PX11 to PXnm may be arranged in the form of a diamond-shaped Pentile™.

The signal lines GL1 to GLn and DL1 to DLm may include gate lines GL1 to GLn and data lines DL1 to DLm. Each of the pixels PX11 to PXnm may be connected to a corresponding gate line among the gate lines GL1 to GLn and a corresponding data line among the data lines DL1 to DLm. More various types of signal lines may be provided in the display panel DP according to configurations of the pixel circuits of the pixels PX11 to PXnm.

The driving circuit GDC may be located on a non-display region NDA. The driving circuit GDC may include a gate driving circuit. The gate driving circuit may generate gate signals and sequentially output gate signals to the gate lines GL1 to GLn. The gate driving circuit may further output another control signal to the pixel circuits of the pixels PX11 to PXnm.

The pads PD may be arranged on the non-display region NDA in one direction. The pads PD may be parts connected to a circuit board. Each of the pads PD may be connected to a corresponding signal line among the plurality of signal lines GL1 to GLn and DL1 to DLm and connected to a corresponding pixel through the signal line.

Figure 5:
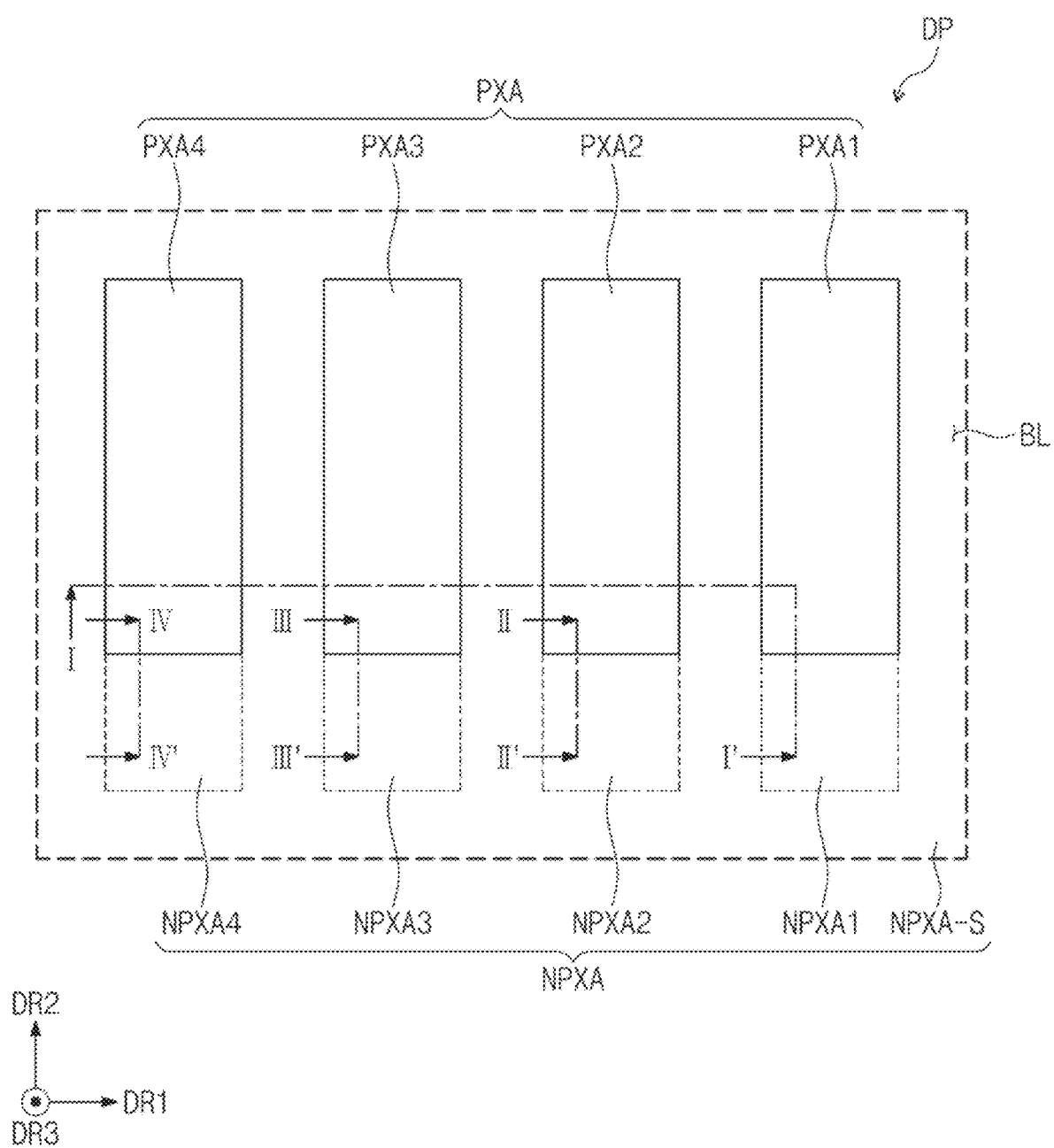
FIG. 5 is an enlarged plan view of a partial area of a display panel according to an embodiment of the inventive concept.

FIG. 5 is a plan view of a partial configuration of a display panel according to an embodiment of the inventive concept. FIG. 5 illustrates a plane of a base layer BL when the rear surface of the display panel DP is viewed, and is an enlarged view of a portion of the display region DA (see FIG. 2) in the base layer BL.

Referring to FIG. 5, the base layer BL may include light emitting regions PXA and a non-light emitting region NPXA surrounding the light emitting regions PXA. For convenience of description in an embodiment of the inventive concept, the light emitting regions PXA and the non-light emitting region NPXA are described as divided regions on the base layer BL. However, substantially, the light emitting regions PXA may correspond to areas of pixel openings P-OP defined in a pixel defining layer PDL which will be described in FIG. 6, and the non-light emitting regions NPXA may be defined as regions that overlap the pixel defining layer PDL.

The light emitting regions PXA may correspond to regions that emit light through four pixels arranged in the first direction DR1 among the pixels PX11 to PXnm (see FIG. 4).

The light emitting regions PXA may include a first light emitting region PXA1, a second light emitting region PXA2, a third light emitting region PXA3, and a fourth light emitting region PXA4. The first to fourth light emitting regions PXA1, PXA2, PXA3, and PXA4 may be distinguished from each other according to colors of light when source light provided from first to fourth light emitting elements LD1, LD2, LD3, and LD4 (see FIG. 6) is emitted toward the outside of the display device DD (see FIG. 1).

In the embodiment, the first light emitting region PXA1, the second light emitting region PXA2, and the third light emitting region PXA3 may be defined as regions of providing first color light, second color light, and third color light. The first to third color light may be light having different colors. In the embodiment, the first to third color light may be provided as a combination of red light, green light, and blue light.

Figure 6:
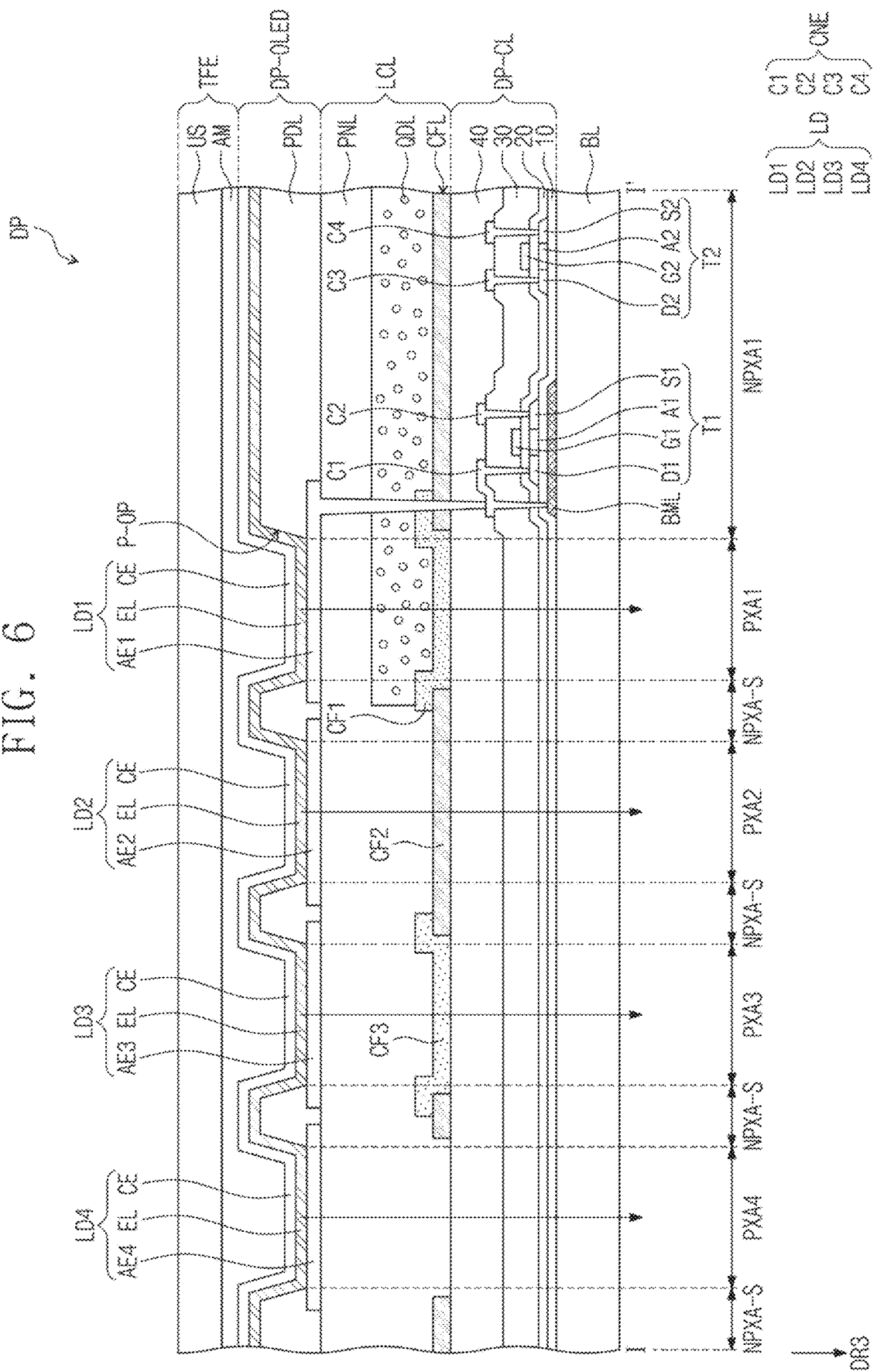
FIG. 6 is a cross-sectional view of a display panel according to an embodiment of the inventive concept, taken along line I-I' of FIG. 5.

The fourth light emitting region PXA4 may provide light of color that corresponds to the source light provided from the light emitting element LD4 (see FIG. 6). According to an embodiment of the inventive concept, the fourth light emitting region PXA4 may be omitted.

The first to fourth light emitting regions PXA1, PXA2, PXA3, and PXA4 may have various shapes on a plane. For example, each of the first to fourth light emitting regions PXA1, PXA2, PXA3, and PXA4 may have a quadrangular shape. However, the embodiment of the inventive concept is not limited thereto, and each of the first to fourth light emitting regions PXA1, PXA2, PXA3, and PXA4 may have a polygonal, circular, oval, or amorphous shape.

The first to fourth light emitting regions PXA1, PXA2, PXA3, and PXA4 may have the same shape on a plane. However, the embodiment of the inventive concept is not limited thereto, and some of the first to fourth light emitting regions PXA1, PXA2, PXA3, and PXA4 may have different shapes.

The first to fourth light emitting regions PXA1, PXA2, PXA3, and PXA4 may have the same area on a plane. However, the embodiment of the inventive concept is not limited thereto, and at least some of the first to fourth light emitting regions PXA1, PXA2, PXA3, and PXA4 may have areas that are different from each other on a plane depending on colors of light being emitted. For example, the area of the light emitting region that emits the green light is the largest, and the area of the light emitting region that emits the blue light is the smallest.

The embodiment illustrated in FIG. 5 is merely an example, and the shapes, areas, and arrangement of the first to fourth light emitting regions PXA1, PXA2, PXA3, and PXA4 may be diversely designed according to design of the display panel DP and light emitting efficiency of light.

The non-light emitting regions NPXA may be regions that set boundaries between the first to fourth light emitting regions PXA1, PXA2, PXA3, and PXA4 and prevent color mixing between the first to fourth light emitting regions PXA1, PXA2, PXA3, and PXA4.

In the embodiment, the non-light emitting regions NPXA may include first to fourth non-light emitting regions NPXA1, NPXA2, NPXA3, and NPXA4 and a peripheral non-light emitting region NPXA-S.

The first to fourth non-light emitting regions NPXA1, NPXA2, NPXA3, and NPXA4 may correspond to regions in which circuit elements are arranged. In the embodiment, the circuit elements may include first to fourth pixel circuits which are connected to the first to fourth light emitting elements LD1, LD2, LD3, and LD4 (see FIG. 6), respectively. The first to fourth pixel circuits may be spaced apart from the first to fourth light emitting regions PXA1, PXA2, PXA3, and PXA4.

The first to fourth non-light emitting regions NPXA1, NPXA2, NPXA3, and NPXA4 and the first to fourth light emitting regions PXA1, PXA2, PXA3, and PXA4 may be arrayed in a second direction DR2, respectively. The first to fourth non-light emitting regions NPXA1, NPXA2, NPXA3, and NPXA4 may be arranged apart from each other in a first direction DR1.

The peripheral non-light emitting region NPXA-S may surround the first to fourth light emitting regions PXA1, PXA2, PXA3, and PXA4 and the first to fourth non-light emitting regions NPXA1, NPXA2, NPXA3, and NPXA4.

FIG. 5 illustrates that each of the first to fourth light emitting regions PXA1, PXA2, PXA3, and PXA4 has one region, but a group formed by the first to fourth light emitting regions PXA1, PXA2, PXA3, and PXA4 may be repeatedly arranged in a certain arrangement. The first to fourth light emitting regions PXA1, PXA2, PXA3, and PXA4 may be arranged in the first direction DR1 and the second direction DR2.

Figure 7A:
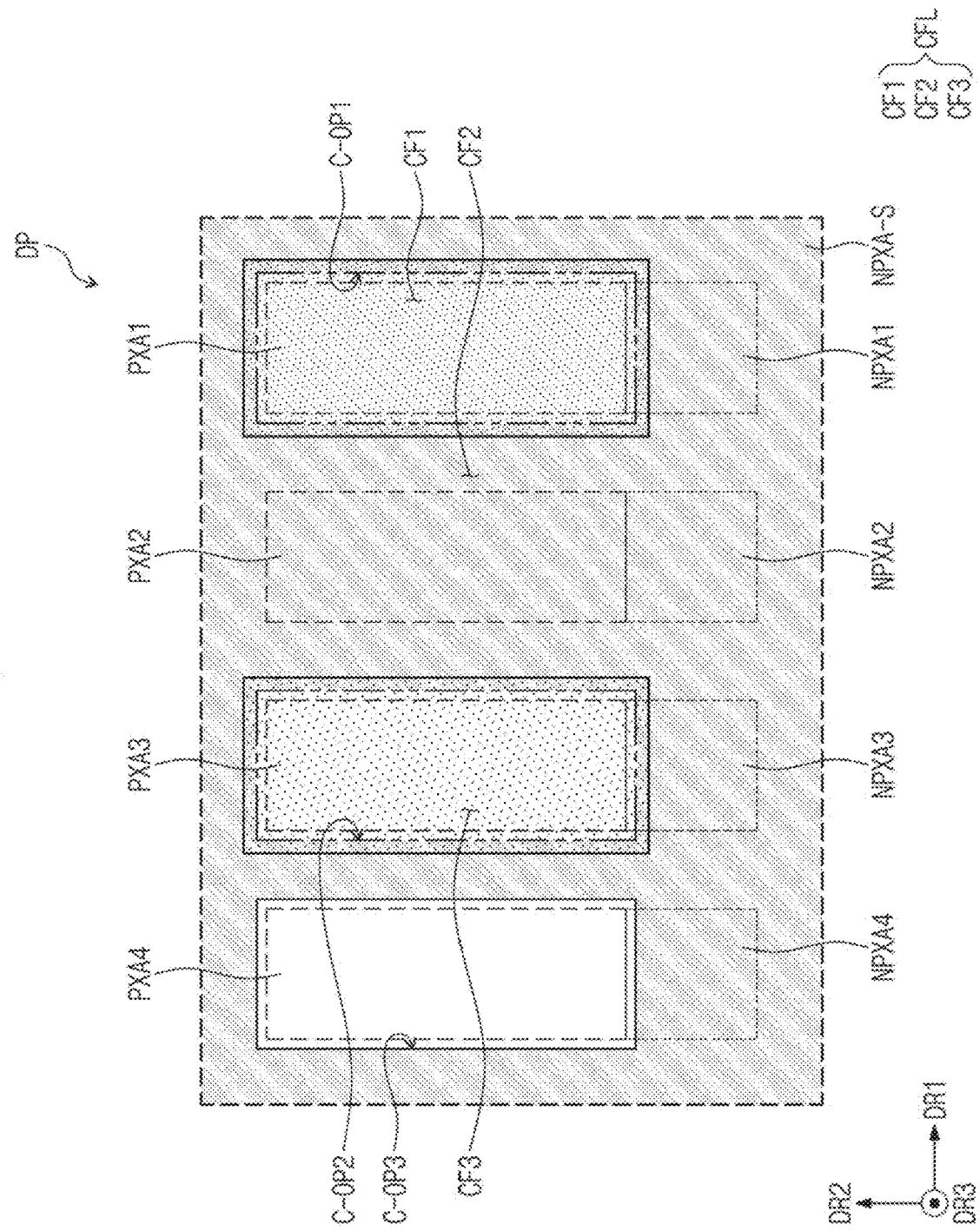
FIG. 7A is a plan view of a partial configuration of a display panel according to an embodiment of the inventive concept.
Figure 7B:
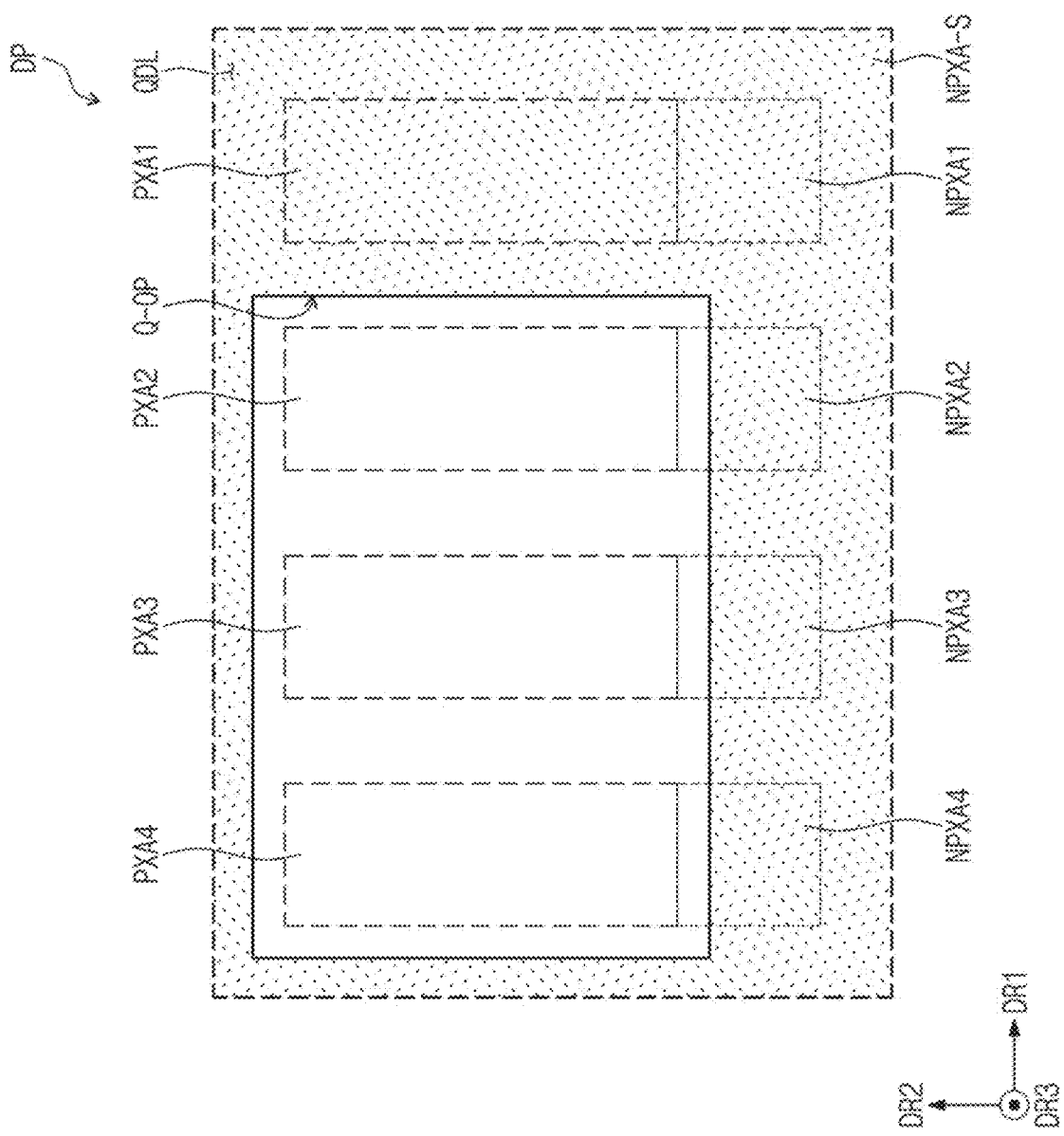
FIG. 7B is a plan view of a partial configuration of a display panel according to an embodiment of the inventive concept.
Figure 8:
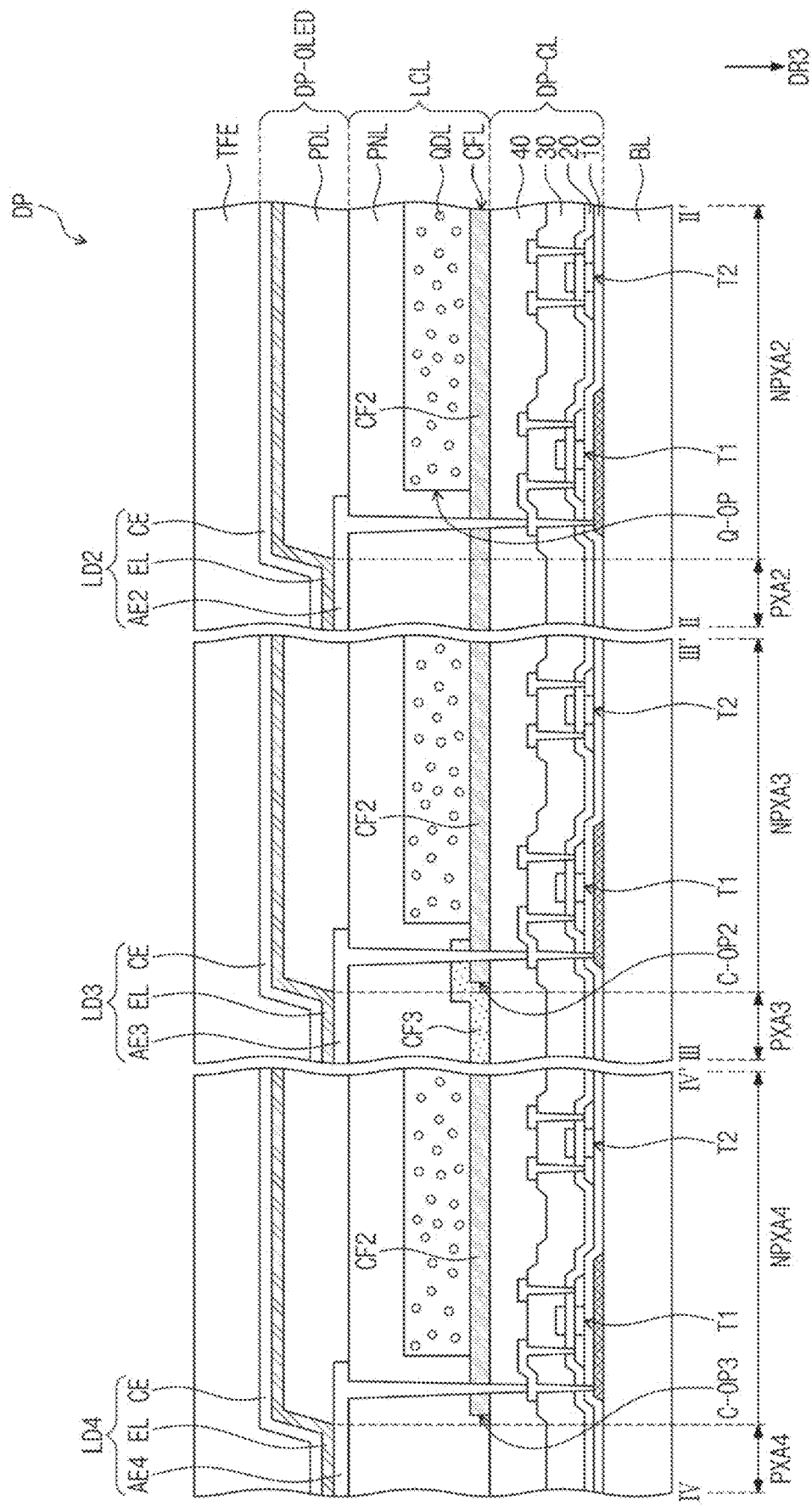
FIG. 8 is a cross-sectional view of a display panel according to an embodiment of the inventive concept, taken along lines II-II', III-III', and IV-IV' of FIG. 5.

FIG. 6 is a cross-sectional view of a display panel according to an embodiment of the inventive concept, taken along line I-I' of FIG. 5. FIG. 7A is a plan view of a partial configuration of a display panel according to an embodiment of the inventive concept. FIG. 7B is a plan view of a partial configuration of a display panel according to an embodiment of the inventive concept. FIG. 8 is a cross-sectional view taken along lines II-II', III-III', and IV-IV' of FIG. 5.

Referring to FIGS. 6 to 7B, a display panel DP according to an embodiment of the inventive concept may include a base layer BL, a circuit element layer DP-CL, a light control layer LCL, a display element layer DP-OLED, and an encapsulation layer TFE.

The base layer BL may include an optically transparent insulating material. For example, the base layer BL may include a glass substrate or a synthetic resin film. When the base layer BL is a synthetic resin film, the base layer BL may include a polyimide (PI) film or a polyethylene terephthalate (PET) film.

The base layer BL may have a multilayer structure or a single layer structure. For example, the base layer BL may include a plurality of synthetic resin films coupled to each other by an adhesive, or a glass substrate and a synthetic resin film which are coupled to each other by an adhesive. Although not illustrated, the base layer BL may further include functional layers such as an anti-fingerprint layer and an impact absorbing layer.

The circuit element layer DP-CL may be disposed on the base layer BL. The circuit element layer DP-CL may include a plurality of insulating layers 10 to 40, transistors, a light blocking pattern BML, and connection electrodes CNE. The plurality of insulating layers 10 to 40 may include first, second, third, and fourth insulating layers 10, 20, 30, and 40, respectively. FIG. 6 illustrates, as an example, a driving transistor T1 and a switching transistor T2 among the transistors.

The driving transistor T1 supplies light emitting elements LD with electric current, which is proportional to the driving voltage, and makes the light emitting elements LD emit light. The switching transistor T2 is turned on when scan pulses are supplied to the gate lines GL1 to GLn (see FIG. 4), and data signals supplied to the data lines DL1 to DLm (see FIG. 4) are supplied to a first gate G1 of the driving transistor T1.

The first insulating layer 10 may be disposed on the base layer BL. The first insulating layer 10 may prevent foreign substances from entering from the outside. The first insulating layer 10 may include an inorganic material. For example, the first insulating layer 10 may include at least one of silicon oxide or silicon nitride. Also, silicon oxide layers and silicon nitride layers may be alternately laminated on each other in the first insulating layer 10.

The light blocking pattern BML may be disposed on the base layer BL and covered by the first insulating layer 10. The light blocking pattern BML is disposed below the driving transistor T1, and thus, it is possible to prevent electric current-voltage characteristics of a semiconductor pattern of the driving transistor T1 from being deteriorated by external light. Accordingly, the display panel DP having enhanced reliability may be provided.

A semiconductor pattern included in the driving transistor T1 and a semiconductor pattern included in the switching transistor T2 may be disposed on the first insulating layer 10. The semiconductor pattern of the driving transistor T1 may be divided into a first active A1, a first source S1, and a first drain D1. The semiconductor pattern of the switching transistor T2 may be divided into a second active A2, a second source S2, and a second drain D2. The first active A1, the first source S1, the first drain D1, the second active A2, the second source S2, and the second drain D2 may be regions which are distinguished from each other according to doping concentration and electrical conductivity of the semiconductor pattern.

The second insulating layer 20 may be disposed on the first insulating layer 10 and cover the semiconductor pattern of the driving transistor T1 and the semiconductor pattern of the switching transistor T2. The second insulating layer 20 may include an inorganic material.

A first gate G1 and a second gate G2 may be disposed on the second insulating layer 20. The first gate G1 may overlap the first active A1. The first gate G1 may serve as a mask in a process of doping the semiconductor pattern of the driving transistor T1. The second gate G2 may overlap the second active A2. The second gate G2 may serve as a mask in a process of doping the semiconductor pattern of the switching transistor T2.

The third insulating layer 30 may be disposed on the second insulating layer 20 and cover the first gate G1 and the second gate G2. The third insulating layer 30 may include an organic material.

The connection electrodes CNE may be disposed on the third insulating layer 30. The connection electrodes CNE may include first to fourth connection electrodes C1, C2, C3, and C4.

One side of the first connection electrode C1 may pass through the second and third insulating layers 20 and 30 and be connected to the first drain D1. The other side of the first connection electrode C1 may pass through the first to third insulating layers 10, 20, and 30 and be connected to the light blocking pattern BML. Here, the light blocking pattern BML may receive a certain signal. However, the embodiment is not limited thereto, and the connection electrodes CNE may be separated from the light blocking pattern BML and disposed while floating. The second connection electrode C2 may pass through the second and third insulating layers 20 and 30 and be connected to the first source S1.

The third connection electrode C3 may pass through the second and third insulating layers 20 and 30 and be connected to the second drain D2. The fourth connection electrode C4 may pass through the second and third insulating layers 20 and 30 and be connected to the second source S2.

The fourth insulating layer 40 may be disposed on the third insulating layer 30 and cover the connection electrodes CNE. The fourth insulating layer 40 may include an organic material.

FIG. 6 illustrates, as an example, that the circuit element layer DP-CL includes the first to fourth insulating layers 10 to 40. However, the embodiment of the inventive concept is not limited thereto. Some of the first to fourth insulating layers 10 to 40 may be omitted, and another insulating layer may be added. Also, materials included in the first to fourth insulating layers 10 to 40 are not limited to one embodiment.

The display element layer DP-OLED may be disposed above the circuit element layer DP-CL. The display element layer DP-OLED may include light emitting elements LD and a pixel defining layer PDL. The light emitting elements LD may include first to fourth light emitting elements LD1, LD2, LD3, and LD4. The first to fourth light emitting elements LD1, LD2, LD3, and LD4 may include first electrodes AE1, AE2, AE3, and AE4, a light emitting stack EL, and a second electrode CE, respectively.

The first electrodes AE1, AE2, AE3, and AE4 may be disposed on the light control layer LCL. The first electrodes AE1, AE2, AE3, and AE4 may pass through the light control layer LCL and the fourth insulating layer 40 and be connected to the first connection electrode C1. The first electrodes AE1, AE2, AE3, and AE4 may be made of a transparent conductive film such as an indium-tin-oxide (ITO) or an indium-zinc-oxide (IZO) and allow the light generated in the light emitting stack EL to pass therethrough toward the base layer BL.

In an embodiment, the first electrodes AE1, AE2, AE3, and AE4 may be provided in the form of a plurality of patterns. The first electrodes AE1, AE2, AE3, and AE4, which respectively correspond to the first light emitting element LD1, the second light emitting element LD2, the third light emitting element LD3, and the fourth light emitting element LD4, may be spaced apart from each other. However, the embodiment of the inventive concept is not limited thereto, and the first electrodes AE1, AE2, AE3, and AE4 may be arranged on the entire surface of the display region DA (see FIG. 2).

The pixel defining layer PDL is disposed on the light control layer LCL. Pixel openings P-OP may be defined in the pixel defining layer PDL. A pixel opening P-OP may expose at least a portion of each of the first electrodes AE1, AE2, AE3, and AE4. Substantially, each of light emitting regions PXA may correspond to the area of the pixel opening P-OP defined in the pixel defining layer PDL.

The light emitting regions PXA may be defined as corresponding to regions of the first electrodes AE1, AE2, AE3, and AE4, which are exposed from the pixel defining layer PDL through the pixel openings P-OP, among the first electrodes AE1, AE2, AE3, and AE4.

A region, which is exposed from the pixel defining layer PDL, of the first electrode AE1 of the first light emitting element LD1 is defined as a first light emitting region PXA1. A region, which is exposed from the pixel defining layer PDL, of the first electrode AE2 of the second light emitting element LD2 is defined as a second light emitting region PXA2. A region, which is exposed from the pixel defining layer PDL, of the first electrode AE3 of the third light emitting element LD3 is defined as a third light emitting region PXA3. A region, which is exposed from the pixel defining layer PDL, of the first electrode AE4 of the fourth light emitting element LD4 is defined as a fourth light emitting region PXA4. The first to fourth light emitting regions PXA1, PXA2, PXA3, and PXA4 respectively correspond to the first to fourth light emitting regions PXA1, PXA2, PXA3, and PXA4 which have been described in FIG. 5.

In an embodiment, the pixel defining layer PDL may include a light absorbing material. The pixel defining layer PDL may include a black coloring agent. The black coloring agent may include black dye and black pigment. The black coloring agent may include carbon black, metal such as chromium, or an oxide thereof.

The light emitting stack EL may be disposed on the first electrodes AE1, AE2, AE3, and AE4. The light emitting stack EL may be formed by laminating a hole transport layer, a light emitting layer, and an electron transport layer, in this order or reverse order, on the first electrodes AE1, AE2, AE3, and AE4.

Also, the light emitting stack EL may be provided with first and second light emitting stacks which face each other with a charge generation layer therebetween. In this case, an organic light emitting layer of one of the first and second light emitting stacks generates blue light, and an organic light emitting layer of the other one of the first and second light emitting stacks generates yellow-green light. Thus, white light may be generated by the first and second light emitting stacks. However, the embodiment of the inventive concept is not limited thereto, and colors of the light provided by the light emitting stack EL may be variously changed according to embodiments of the inventive concept.

The light emitting stack EL may be disposed, as a common layer, in the light emitting regions PXA and the non-light emitting region NPXA. However, the embodiment of the inventive concept is not limited thereto, and the light emitting stack EL may be disposed corresponding to the light emitting regions PXA.

The second electrode CE may be disposed on the light emitting stack EL. The second electrode CE may have the form of a single layer structure that includes an opaque conductive film having high reflection efficiency, or may have the form of a multilayer structure that includes a transparent conductive film and an opaque conductive film having high reflection efficiency. The second electrode CE may reflect the light, which is generated in the light emitting stack EL, toward the base layer BL.

The second electrode CE may be disposed, as a common layer, in the light emitting regions PXA and the non-light emitting region NPXA. However, the embodiment of the inventive concept is not limited thereto, and the second electrode CE may be disposed corresponding to the light emitting regions PXA.

The light control layer LCL may be located between the circuit element layer DP-CL and the display element layer DP-OLED. In the embodiment, the light control layer LCL may include a color filter layer CFL, a quantum dot layer QDL, and a planarization layer PNL.

The color filter layer CFL may be disposed on the fourth insulating layer 40. The color filter layer CFL may include first to third color filter layers CF1, CF2, and CF3. Each of the first to third color filters CF1, CF2, and CF3 allows light in a specific wavelength range to pass therethrough, but blocks light in a wavelength range other than the corresponding wavelength range.

As illustrated in FIG. 7A, first, second, and third transmission openings C-OP1, C-OP2, and C-OP3, which correspond to the first, third, and fourth light emitting regions PXA1, PXA3, and PXA4, respectively, may be defined in the second color filter CF2. The second color filter CF2 may overlap the second light emitting region PXA2. Also, the second color filter CF2 may overlap at least a portion of each of the first to fourth non-light emitting regions NPXA1, NPXA2, NPXA3, and NPXA4 and the peripheral non-light emitting region NPXA-S.

The first color filter CF1 may overlap the first light emitting region PXA1 and cover the first transmission opening C-OP1 of the second color filter CF2. The third color filter CF3 may overlap the third light emitting region PXA3 and cover the second transmission opening C-OP2 of the second color filter CF2. The color filter layer CFL may not overlap the fourth light emitting region PXA4.

Accordingly, in the first light emitting region PXA1, the first color filter CF1 may allow first color light to pass therethrough but block second and third color light. In the second light emitting region PXA2, the second color filter CF2 may allow the second color light to pass therethrough but block the first and third color light. In the third light emitting region PXA3, the third color filter CF3 may allow the third color light to pass therethrough but block the first and second color light. The source light may pass without a change in the fourth light emitting region PXA4.

As illustrated in FIG. 6, the quantum dot layer QDL may be disposed on the color filter layer CFL. In the embodiment, the quantum dot layer QDL may overlap the first light emitting region PXA1. Also, the quantum dot layer QDL may overlap at least a portion of each of the first to fourth non-light emitting regions NPXA1, NPXA2, NPXA3, and NPXA4 and the peripheral non-light emitting region NPXA-S.

As illustrated in FIG. 7B, a control opening Q-OP, which overlaps the second to fourth light emitting regions PXA2, PXA3, and PXA4, may be defined in the quantum dot layer QDL. FIG. 7B illustrates, as an example, that one control opening Q-OP is defined, but the embodiment of the inventive concept is not limited thereto. A plurality of control openings, which correspond to the second to fourth light emitting regions PXA2, PXA3, and PXA4, respectively, may be defined in the quantum dot layer QDL.

The quantum dot layer QDL may include a base resin and quantum dots mixed (or dispersed) in the base resin.

The base resin may be a medium in which quantum dots are dispersed, and may include various resin compositions which may be generally referred to as a binder.

The quantum dots may be particles which convert an wavelength of incident light. The quantum dots are materials having a crystal structure with a size of several nanometers and are composed of several hundreds to several thousands of atoms, and exhibits a quantum confinement effect in which an energy band gap increases due to small size thereof. When light with a wavelength having higher energy than the band gap is incident on the quantum dots, the quantum dots are excited by absorbing the light and transition to a ground state while emitting light having a specific wavelength. The energy of the emitted light has a value corresponding to the band gap. When the sizes and compositions of the quantum dots are adjusted, the light emission characteristics due to the quantum confinement effect may be controlled.

The quantum dots may be selected from a Group II-VI compound, a Group I-III-VI compound, a Group III-V compound, a Group IV-VI compound, a Group IV element, a Group IV compound, and a combination thereof.

The group II-VI compound may be selected from the group consisting of: a binary element compound selected from the group consisting of CdSe, CdTe, CdS, ZnS, ZnSe, ZnTe, ZnO, HgS, HgSe, HgTe, MgSe, MgS, and a mixture thereof; a ternary element compound selected from the group consisting of AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group I-III-VI compound may be selected from: a ternary element compound selected from the group consisting of $AgInS_2$, $CuInS_2$, $AgGaS_2$, $CuGaS_2$, and a mixture thereof; or a quaternary element compound such as $AgInGaS_2$ and $CuInGaS_2$.

The Group III-V compound may be selected from the group consisting of: a binary element selected from the group consisting of GaN, GaP, GaAs, GaSb, AlN, AlP, AlAs, AlSb, InN, InP, InAs, InSb, and a mixture thereof; a ternary element selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary element selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. Here, the Group III-V compound may further include Group II metal. For example, InZnP or the like may be selected as the Group III-II-V compound.

The Group IV-VI compound may be selected from the group consisting of: a binary element compound selected from the group consisting of SnS, SnSe, SnTe, PbS, PbSe, PbTe, and a mixture thereof; a ternary element compound selected from the group consisting of SnSeS, SnSeTe, SnSTe, PbSeS, PbSeTe, PbSTe, SnPbS, SnPbSe, SnPbTe, and a mixture thereof; and a quaternary element compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary element compound selected from the group consisting of SiC, SiGe, and a mixture thereof.

Here, the binary element compound, the ternary element compound, or the quaternary element compound may exist in the respective particles at uniform concentrations, or exist in the same particle while concentration distributions thereof are partially differently divided.

The quantum dots may have a core-shell structure that includes a core and a shell surrounding the core. In addition, the quantum dots may have a core/shell structure in which one quantum dot surrounds another quantum dot. The interface between the core and shell may have a concentration gradient in which the concentration of elements present in the shell is gradually reduced toward the core.

In addition, the quantum dots have shapes which are commonly used in related fields and are not particularly limited. However, more specifically, shapes such as spherical shapes, pyramidal shapes, multi-arm shapes, cubic nanoparticles, nanotubes, nanowires, nanofibers, and nano plate-like particles may be used. The quantum dots may adjust the color of light being emitted according to particle sizes.

In the embodiment, the quantum dots may convert at least a portion of the source light, which is provided from the first light emitting element LD1, into a wavelength range of the first color light. According to the embodiment, the first color light may be any one of the red light or the green light.

For example, when the first color light is red light, the second color light may be blue light, and the third color light may be green light. Also, on the contrary, the second color light may be green light, and the third color light may be blue light. When the first color light is red light, the source light provided from the light emitting elements LD may be any one of white light or cyan light.

Here, when the source light is white light, the quantum dots may convert the light, having a red light wavelength range, among the source light into the red light having enhanced color purity, or may convert the light, having a blue light or green light wavelength range, into the red light. When the source light is cyan light, the quantum dots may convert the light, having a blue light or green light wavelength range, among the source light into the red light.

For example, when the first color light is green light, the second color light may be blue light, and the third color light may be red light. Also, on the contrary, the second color light may be red light, and the third color light may be blue light. When the first color light is green light, the source light provided from the light emitting elements LD may be any one of white light or magenta light.

Here, when the source light is white light, the quantum dots may convert the light, having a green light wavelength range, among the source light into the green light having enhanced color purity, or may convert the light, having a blue light or red light wavelength range, into the green light. When the source light is magenta light, the quantum dots may convert the light, having a blue light or red light wavelength range, among the source light into the green light.

According to a light emitting wavelength spectrum of the source light, a full width at half maximum (FWHM) of the red light may be larger than an FWHM of each of the green light and the blue light. The FWHM represents a wavelength width between points that have ½ of a maximum light emitting intensity. A narrower FWHM of a light emitting wavelength spectrum with respect to light of a specific color represents that light having high color purity is provided. That is, red light having low color purity may be provided on the light control layer.

Also, the red light has a wide FWHM, the wavelength range of the red light and the wavelength range of the green light may partially overlap each other. That is, the light of a low wavelength band among the red light overlaps the light of a high wavelength band among the green light, and thus color purity of the source light may be lowered.

Also, a color filter, which allows red light to pass therethrough, may block only light of a wavelength lower than the wavelength range of the red light, and thus may not block light of a high wavelength band among the red light. That is, red light having low color purity may be provided on a light emitting region that emits red light.

Thus, unlike the embodiment, when the source light provided from the first light emitting element LD1 passes through only the first color filter CF1, the FWHM of the red light may be wide in the light emitting wavelength spectrum. The wavelength range of the red light and the wavelength range of the green light may not be clearly distinguished from each other. Accordingly, the color purity and color reproducibility of the red light may be deteriorated.

On the other hand, according to the embodiment, at least a portion of the source light provided from the first light emitting element LD1 may be converted into red light or green light by quantum dots while passing through the quantum dot layer QDL.

The quantum dots may be nanometer-scale particles. The quantum dots may have an FWHM of a light emitting wavelength spectrum of about 45 nm or less, preferably about 40 nm or less, more preferably about 30 nm or less.

Thus, when the first color light is the red light, the source light provided from the first light emitting element LD1 may be converted into the red light having an FWHM reduced by the quantum dots. As the FWHM of the red light is reduced, the wavelength range of the green light and the wavelength range of the red light may be more clearly distinguished from each other in the light emitting wavelength spectrum. Thus, the source light passes through the quantum dot layer QDL and is converted into the red light having a reduced FWHM, and then passes through the first color filter CF1. Thus, the red light provided in the first light emitting region PXA1 may have enhanced color purity and color reproducibility.

Also, when the first color light is the green light, at least a portion of the source light provided from the first light emitting element LD1 may be converted into green light having an FWHM reduced by the quantum dots while passing through the quantum dot layer QDL. Likewise, the wavelength range of the green light and the wavelength range of the red light may be more clearly distinguished from each other in the light emitting wavelength spectrum. The color purity and color reproducibility of the green light provided in the first light emitting region PXA1 may be enhanced.

Therefore, according to an embodiment of the inventive concept, the quantum dot layer QDL is disposed overlapping one light emitting region among the light emitting regions PXA, and at least a portion of the source light is converted into one color within the one light emitting region. Thus, the light having enhanced color purity and color reproducibility may be provided.

According to an embodiment, the quantum dot layer QDL may be provided through a photolithography process. The quantum dot layer QDL overlaps one light emitting region (e.g., the first light emitting region PXA1) and the non-light emitting region NPXA, and has the control opening Q-OP that exposes other light emitting regions (e.g., the second to fourth light emitting regions PXA2, PXA3, and PXA4), and thus may be conveniently provided through a photolithography process.

As illustrated in FIG. 6, the planarization layer PNL may be located between the circuit element layer DP-CL and the display element layer DP-OLED and cover the color filter layer CFL and the quantum dot layer QDL. The planarization layer PNL may include an organic material. The organic material may be transparent and may include, for example, an acryl-based resin. The planarization layer PNL may provide the display element layer DP-OLED with a flat surface.

The encapsulation layer TFE may be disposed on the display element layer DP-OLED. The encapsulation layer TFE may cover the display element layer DP-OLED. According to an embodiment, the encapsulation layer TFE may include an upper substrate US and an adhesive member AM that couples the upper substrate US to the display element layer DP-OLED. The upper substrate US may include a transparent or opaque material. For example, the upper substrate US may include silver, glass, plastics such as polyimide, a metal foil, and the like.

FIG. 8 illustrates a cross-section of the display panel DP in the second light emitting region PXA2 and the second non-light emitting region NPXA2, a cross-section of the display panel DP in the third light emitting region PXA3 and the third non-light emitting region NPXA3, and a cross-section of the display panel DP in the fourth light emitting region PXA4 and the fourth non-light emitting region NPXA4.

Referring to FIGS. 6 and 8, the quantum dot layer QDL may overlap at least a portion of each of the first to fourth non-light emitting regions NPXA1, NPXA2, NPXA3, and NPXA4. That is, the quantum dot layer QDL may overlap at least a portion of each of the first to fourth circuit elements.

The quantum dot layer QDL may be relatively thicker than the color filters CH, CF2, and CF3. Unlike the embodiment, when the quantum dot layer QDL is disposed overlapping only the first light emitting region PXA1, a protruding stepped portion may be locally formed in a portion of the planarization layer PNL that corresponds to the quantum dot layer QDL located only in the first light emitting region PXA1. Accordingly, stepped portions may be formed in the first electrodes AE1, AE2, AE3, and AE4 and the pixel defining layer PDL, which are disposed on the planarization layer PNL, and the source light may not be uniformly provided from the light emitting element LD.

On the other hand, as in the embodiment, when the quantum dot layer QDL is disposed overlapping the first light emitting region PXA1 and the non-light emitting region NPXA, the quantum dot layer QDL is disposed over a relatively large area. Therefore, formation of a non-ununiform surface due to the protrusion of a local portion of the planarization layer PNL may be minimized. Accordingly, the formation of a non-ununiform surface on the first electrodes AE1, AE2, AE3, and AE4 and the pixel defining layer PDL, which are disposed on the planarization layer PNL, may be minimized, and thus the uniform source light may be provided from the light emitting element LD. Accordingly, the display device DD (see FIG. 1) having enhanced display quality may be provided.

According to the embodiment, the second color filter CF2 may overlap at least a portion of each of the first to fourth non-light emitting regions NPXA1, NPXA2, NPXA3, and NPXA4. That is, the second color filter CF2 may overlap at least a portion of each of the first to fourth circuit elements CL1, CL2, CL3, and CL4.

The second color filter CF2 may cover the second electrode CE in the non-light emitting region NPXA when the rear surface of the display panel DP is viewed. Accordingly, even if internal light is reflected from the second electrode CE in the non-light emitting region NPXA and then discharged toward the base layer BL, the second color filter CF2 may block a portion of the discharged light and reduce an amount of the light that is discharged to the outside via the non-light emitting region NPXA.

Also, even if external light is incident to the non-light emitting region NPXA, the second color filter CF2 may block a portion of the incident light and reduce an amount of the light that is incident to the second electrode CE, and may also reduce an amount of the light that is reflected from the second electrode CE. Thus, the amount of the light discharged in the non-light emitting region NPXA is minimized, and thus the display device DD having enhance display quality may be provided.

That is, the second color filter CF2 may overlap the entire surface of each of the first to fourth circuit elements CL1, CL2, CL3, and CL4. Accordingly, the second color filter CF2 may provide a flat surface to the entire surface of the quantum dot layer QDL, and thus the quantum dot layer QDL may also become flat, and the formation of a non-ununiform surface on the planarization layer PNL may be minimized.

Figure 9:
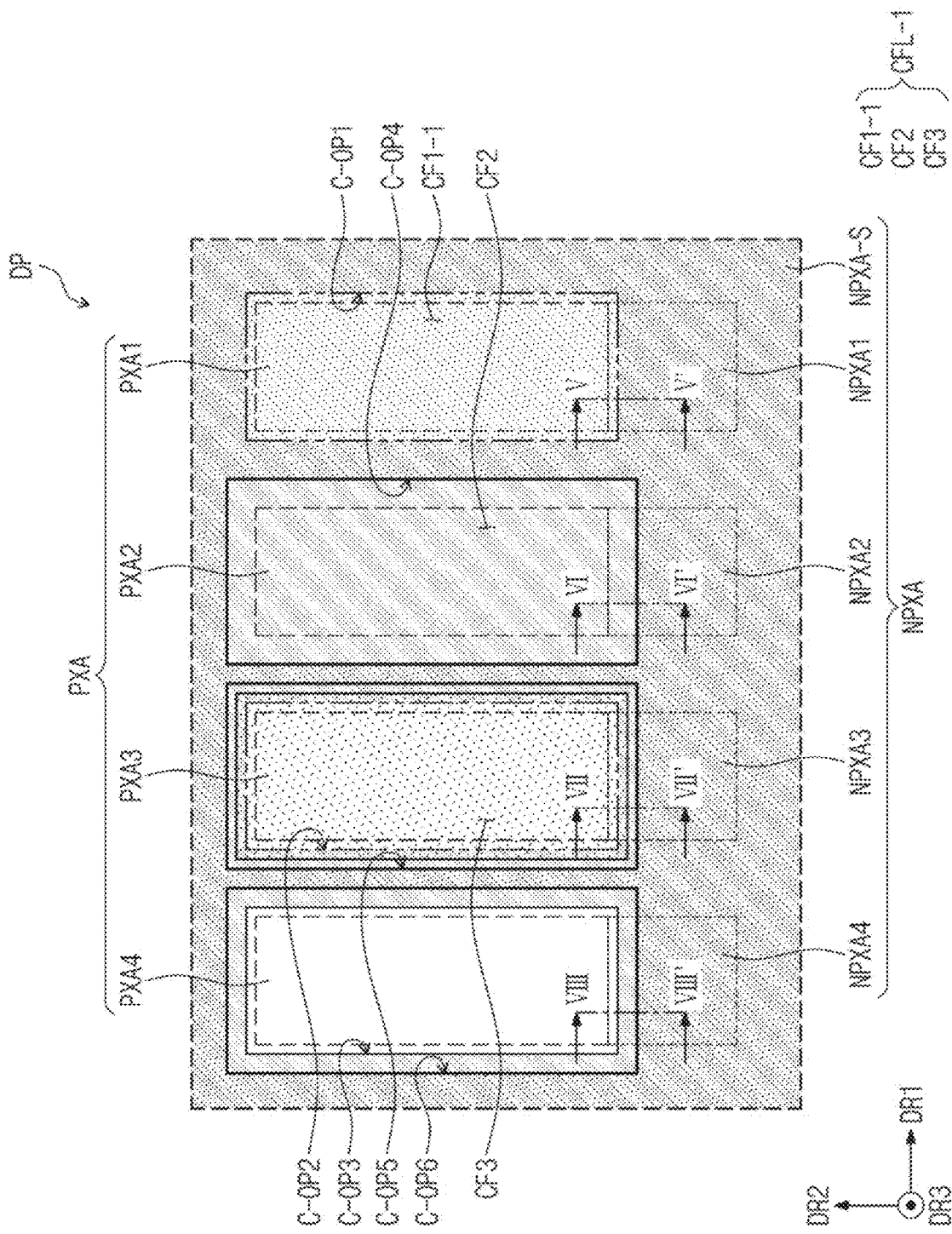
FIG. 9 is a plan view of a partial configuration of a display panel according to an embodiment of the inventive concept.
Figure 10:
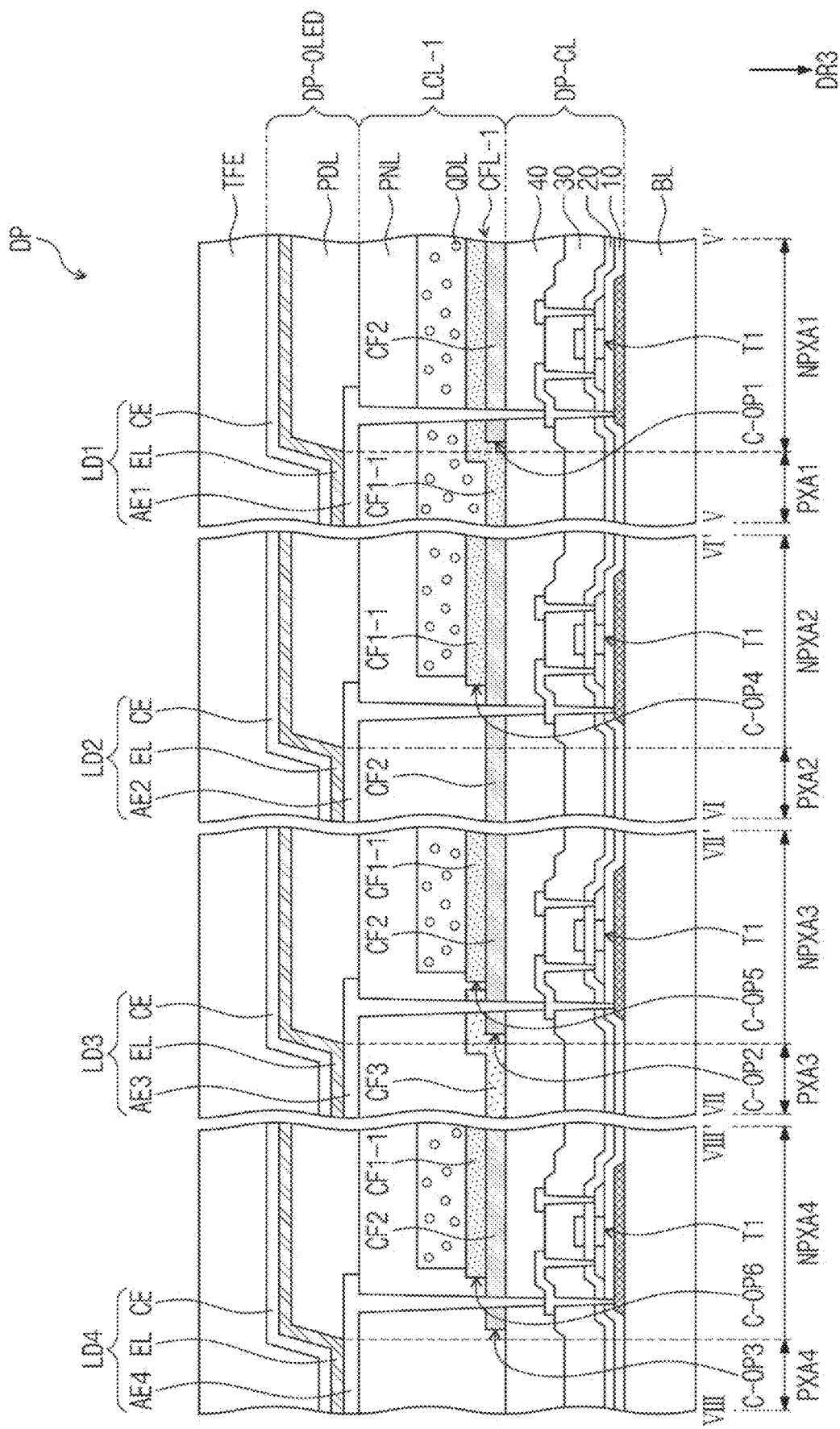
FIG. 10 is a cross-sectional view of a display panel according to an embodiment of the inventive concept, taken along lines V-V', VI-VI', VII-VII', and VIII-VIII' of FIG. 9.

FIG. 9 is a plan view of a partial configuration of a display panel according to an embodiment of the inventive concept. FIG. 10 is a cross-sectional view taken along lines V-V', VI-VI', VII-VII', and VIII-VIII' of FIG. 9.

FIG. 9 illustrates a plane of a color filter layer CFL-1 when the rear surface of a display panel DP is viewed.

Referring to FIGS. 9 and 10, first, second, and third transmission openings C-OP1, C-OP2, and C-OP3, which correspond to first, third, and fourth light emitting regions PXA1, PXA3, and PXA4, respectively, may be defined in a second color filter CF2. The second color filter CF2 may overlap a second light emitting region PXA2 and overlap at least a portion of each of first to fourth non-light emitting regions NPXA1, NPXA2, NPXA3, and NPXA4. That is, the second color filter CF2 may overlap at least a portion of each of first to fourth circuit elements.

In the embodiment, fourth, fifth, and sixth transmission openings C-OP4, C-OP5, and C-OP6, which correspond to the second, third, and fourth light emitting regions PXA2, PXA3, and PXA4, respectively, may be defined in a first color filter CF1-1. The first color filter CF1-1 may overlap the first light emitting region PXA1 and overlap at least a portion of each of the first to fourth non-light emitting regions NPXA1, NPXA2, NPXA3, and NPXA4. That is, the first color filter CF1-1 may overlap at least a portion of each of first to fourth circuit elements CL1, CL2, CL3, and CL4.

A third color filter CF3 may overlap the third light emitting region PXA3. The third color filter CF3 may be located inside the second transmission opening C-OP2 of the second color filter CF2 and cover the second transmission opening C-OP2. FIGS. 9 and 10 illustrate, as an example, that the third color filter CF3 is not in contact with the first color filter CF1-1, but the embodiment of the inventive concept is not limited thereto. The third color filter CF3 may be in contact with the first color filter CF1-1.

The first to third color filters CF1-1, CF2, and CF3 may allow first to third color light to pass therethrough in the first to third light emitting regions PXA1, PXA2, and PXA3, respectively. The color filter layer CFL-1 may not overlap the fourth light emitting region PXA4, and source light provided from a fourth light emitting element LD4 may pass without a change in the fourth light emitting region PXA4.

According to the embodiment, two types of color filters may be located in a non-light emitting region NPXA. For example, the second color filter CF2 disposed on a circuit element layer DP-CL and the first color filter CF1-1 disposed on the second color filter CF2 may be located in each of the first to fourth non-light emitting regions NPXA1, NPXA2, NPXA3, and NPXA4.

First color light may be any one of the red light or the green light. That is, the first color filter CF1-1 may allow any one of the red light or green light to pass therethrough.

When the red light passes through the first color filter CF1-1, the blue light may pass through the second color filter CF2, and the green light may pass through the third color filter CF3. Also, on the contrary, the green light may pass through the second color filter CF2, and the blue light may pass through the third color filter CF3.

When the green light passes through the first color filter CF1-1, the red light may pass through the second color filter CF2, and the blue light may pass through the third color filter CF3. Also, on the contrary, the blue light may pass through the second color filter CF2, and the red light may pass through the third color filter CF3.

According to the embodiment, even if internal light is reflected from a second electrode CE in the non-light emitting region NPXA and then discharged toward a base layer BL, most of the reflected internal light may be blocked while passing through the color filter layer CFL-1 because the two types of color filters for blocking light of different colors are located in the non-light emitting region NPXA.

Also, even if external light is incident to the non-light emitting region NPXA, the two types of color filters for blocking light of different colors block most of the incident external light. Therefore, an amount of the light incident to the second electrode CE may be reduced. Thus, the amount of the light discharged in the non-light emitting region NPXA is minimized, and thus the display device DD (see FIG. 1) having enhance display quality may be provided.

Also, as the thickness of the color filter layer CFL-1 increases in the non-light emitting region NPXA, a relatively thinner quantum dot layer QDL may be located. Therefore, it is possible to reduce the use of quantum dots in the non-light emitting region NPXA in which light conversion is relatively unnecessary than light emitting regions PXA, and thus the display device DD (see FIG. 1) having a reduced cost may be provided.

FIG. 11 is a cross-sectional view of a partial configuration of a display panel according to an embodiment of the inventive concept.

Referring to FIG. 11, three types of color filters may be located in a non-light emitting region NPXA according to an embodiment. For example, a second color filter CF2 disposed on a circuit element layer DP-CL, a first color filter CF1-2 disposed on the second color filter CF2, and a third color filter CF3-2 disposed on the first color filter CF1-2 may be located in each of first to fourth non-light emitting regions NPXA1, NPXA2, NPXA3, and NPXA4.

According to the embodiment, internal light discharged from the non-light emitting region NPXA to the outside may be more completely blocked, and external light incident to the inside may also be more completely blocked. That is, the amount of the light discharged in the non-light emitting region NPXA is minimized, and thus the display device DD (see FIG. 1) having enhance display quality may be provided.

Also, as the thickness of a color filter layer CFL-2 further increases in the non-light emitting region NPXA, a much thinner quantum dot layer QDL may be located. Therefore, it is possible to reduce the use of quantum dots in the non-light emitting region NPXA in which light conversion is relatively unnecessary than light emitting regions PXA, and thus the display device DD (see FIG. 1) having a reduced cost may be provided.

Figure 12A:
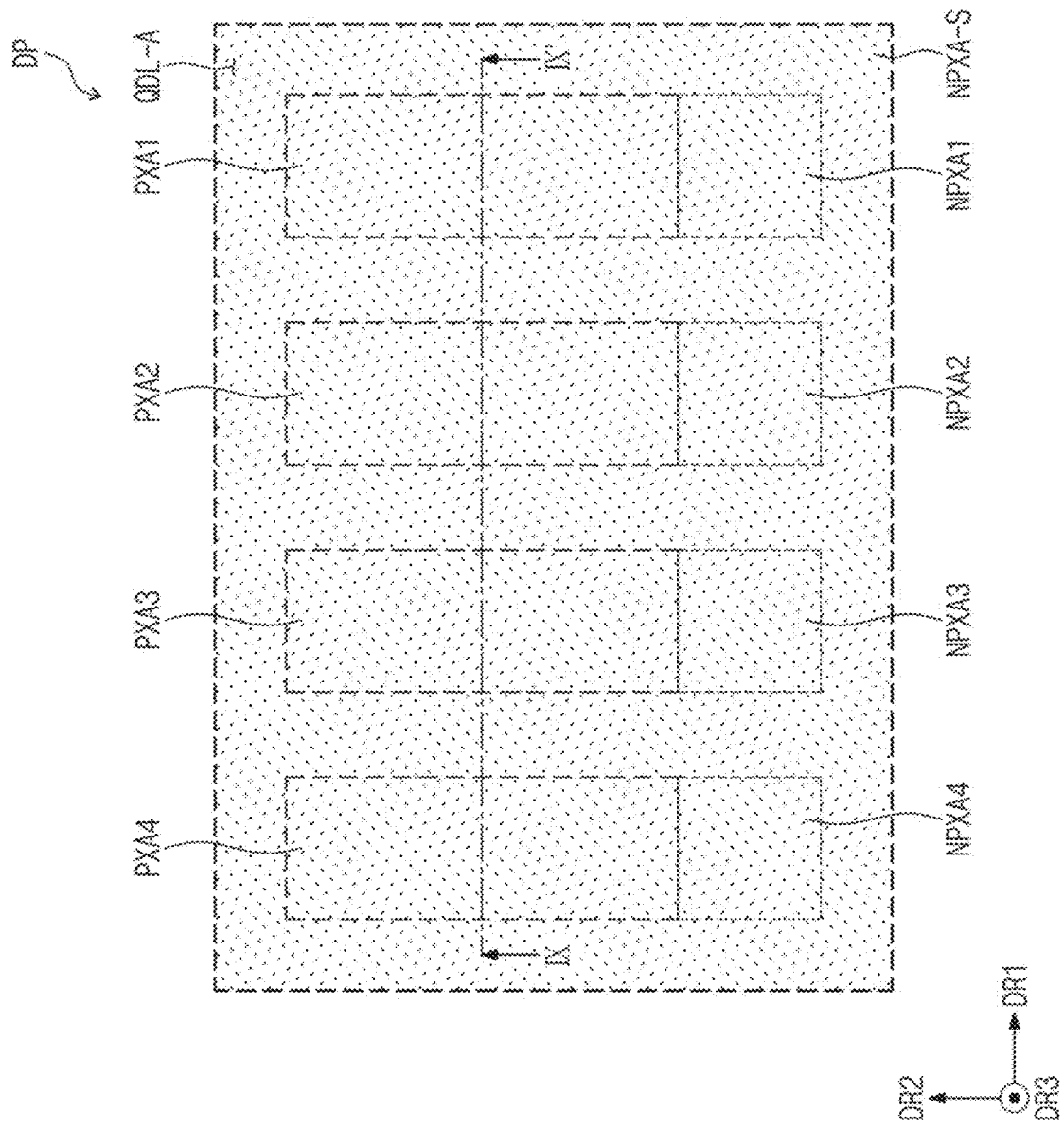
FIG. 12A is a plan view of a partial configuration of a display panel according to an embodiment of the inventive concept.
Figure 12B:
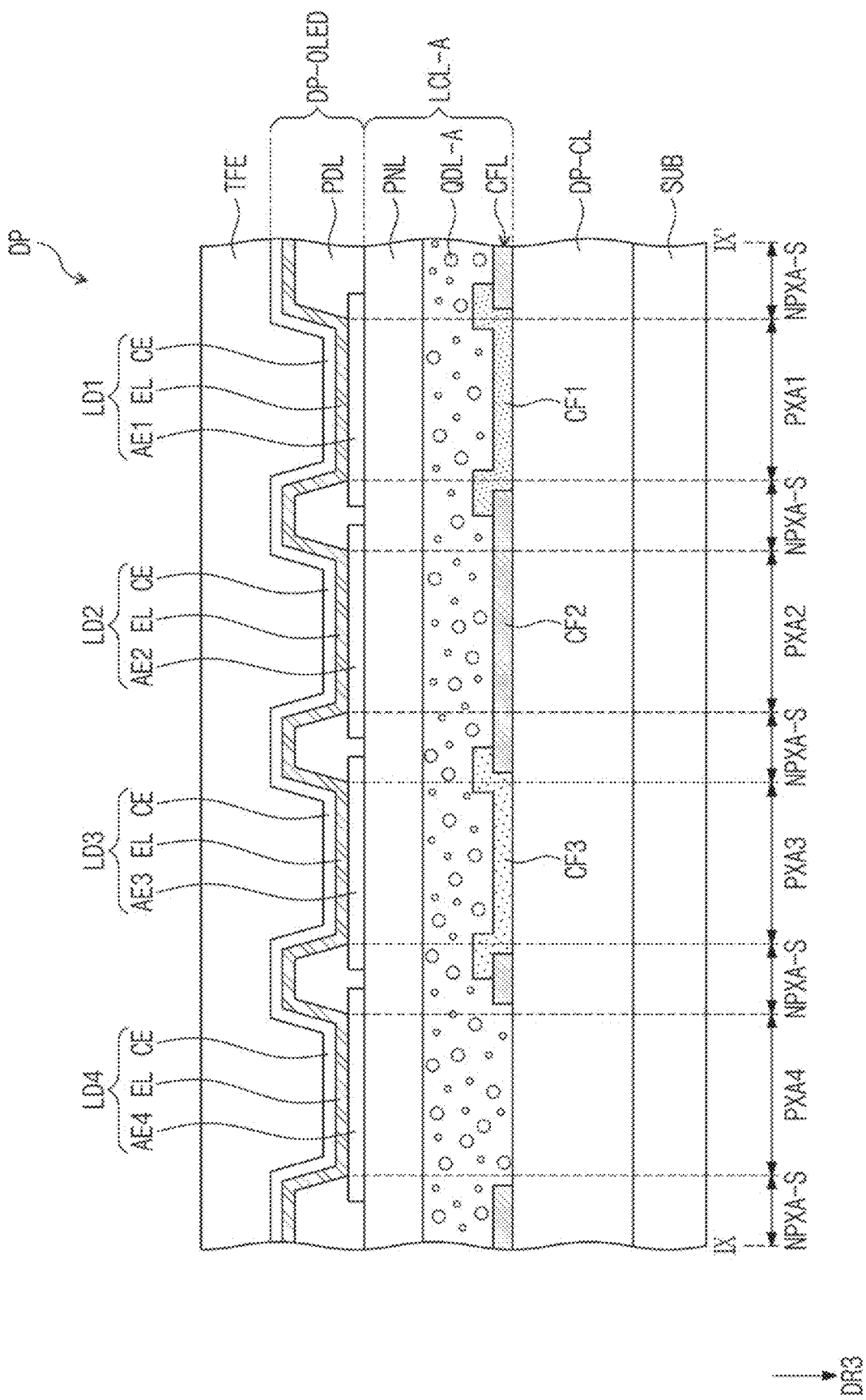
FIG. 12B is a cross-sectional view of a display panel according to an embodiment of the inventive concept, taken along line IX-IX' of FIG. 12A.

FIG. 12A is a plan view of a partial configuration of a display panel according to an embodiment of the inventive concept. FIG. 12B is a cross-sectional view of a display panel according to an embodiment of the inventive concept, taken along line IX-IX' of FIG. 12A. FIG. 12A illustrates a plane of a quantum dot layer QDL-A when the rear surface of a display panel DP is viewed.

Referring to FIGS. 12A and 12B, the quantum dot layer QDL-A according to an embodiment may overlap all of first to fourth light emitting regions PXA1, PXA2, PXA3, and PXA4, first to fourth non-light emitting regions NPXA1, NPXA2, NPXA3, and NPXA4, and a peripheral non-light emitting region NPXA-S. That is, a separate opening may not be defined in the quantum dot layer QDL-A.

In the embodiment, the quantum dot layer QDL-A may include quantum dots and additional quantum dots. Each of the quantum dots may convert at least a portion of source light, which is provided from first to fourth light emitting elements LD1, LD2, LD3, and LD4, into a wavelength range of first color light.

Each of the additional quantum dots may convert at least a portion of the source light, which is provided from the first to fourth light emitting elements LD1, LD2, LD3, and LD4, into a wavelength range of third color light. For example, the first color light may be red light, and the third color light may be green light.

Here, the source light provided from the first to fourth light emitting elements LD1, LD2, LD3, and LD4 may be white light. Also, when the fourth light emitting element LD4 is omitted, the source light provided from the first to third light emitting elements LD1, LD2, and LD3 may be any one of white color, cyan light, magenta light, or blue light.

According to an embodiment of the inventive concept, the quantum dot layer QDL-A may further include scattering agents. The light incident to the quantum dot layer QDL-A may be scattered in several directions by the scattering agents. For example, the scattering agents may include titanium oxide ($TiO_x$), silica-based nanoparticles, or the like. The scattering agents may scatter the light inside the quantum dot layer QDL-A, and thus light conversion efficiency by the quantum dots and the additional quantum dots may be enhanced.

According to the embodiment, a patterning process may be omitted in a process of manufacturing the quantum dot layer QDL-A, and a process of manufacturing the display panel DP may be simplified. Also, the quantum dot layer QDL-A is located on the entire surface of a display region DA, and thus a flat surface may be provided on the entire surface of a display element layer DP-OLED.

Figure 13A:
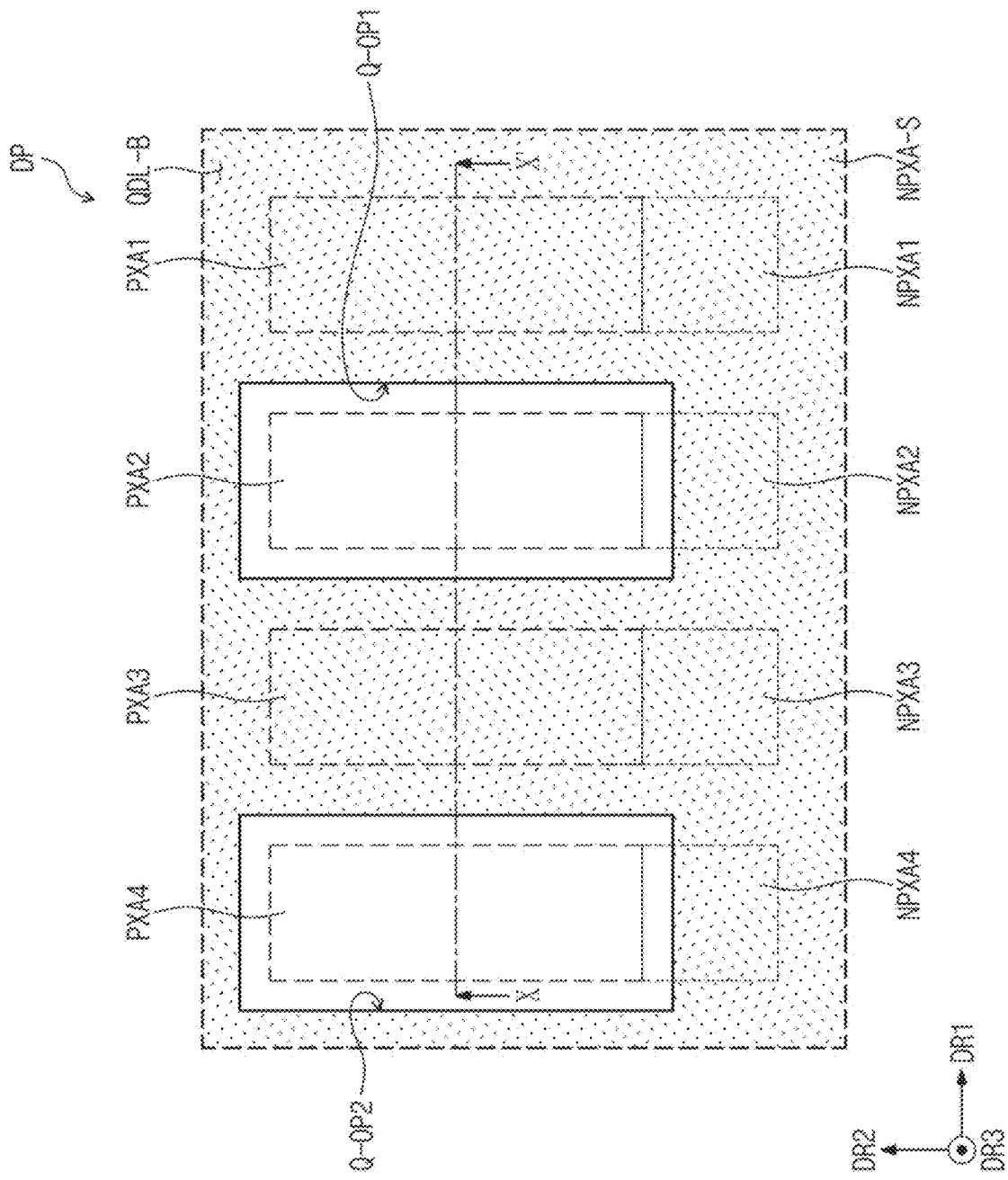
FIG. 13A is a plan view of a partial configuration of a display panel according to an embodiment of the inventive concept.
Figure 13B:
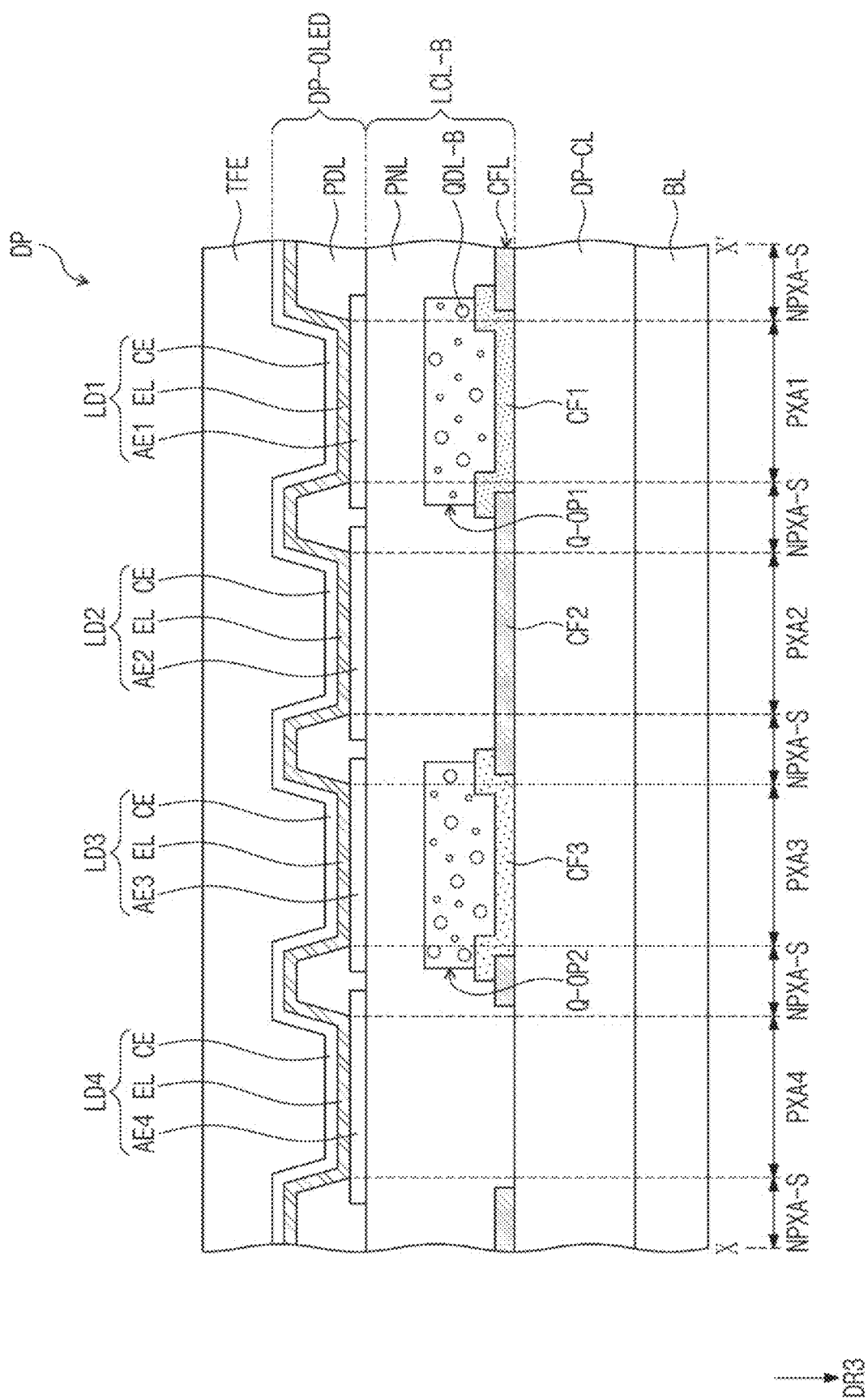
FIG. 13B is a cross-sectional view of a display panel according to an embodiment of the inventive concept, taken along line X-X' of FIG. 13A.

FIG. 13A is a plan view of a partial configuration of a display panel according to an embodiment of the inventive concept. FIG. 13B is a cross-sectional view of a display panel according to an embodiment of the inventive concept, taken along line X-X' of FIG. 13A. FIG. 13A illustrates a plane of a quantum dot layer QDL-B when the rear surface of a display panel DP is viewed.

Referring to FIGS. 13A and 13B, the quantum dot layer QDL-B according to an embodiment may include: quantum dots for converting at least a portion of source light into a wavelength range of first color light; and additional quantum dots for converting at least a portion of the source light into a wavelength range of third color light.

In the embodiment, the quantum dot layer QDL-B may overlap first and third light emitting regions PXA1 and PXA3 and overlap at least a portion of each of first to fourth non-light emitting regions NPXA1, NPXA2, NPXA3, and NPXA4 and a peripheral non-light emitting region NPXA-S. A first control opening Q-OP1 corresponding to the second light emitting region PXA2 and a second control opening Q-OP2 corresponding to a fourth light emitting region PXA4 may be defined in the quantum dot layer QDL-B.

Since source light provided from a second light emitting element LD2 is not converted into wavelength ranges of the first and third color light, it is possible to increase an amount of second color light that passes through a second color filter CF2. Since source light provided from a fourth light emitting element LD4 is not converted into wavelength ranges of the first and third color light, the source light may pass without a change. Thus, according to the embodiment, the display panel DP having enhanced light emitting efficiency may be provided.

Figure 14A:
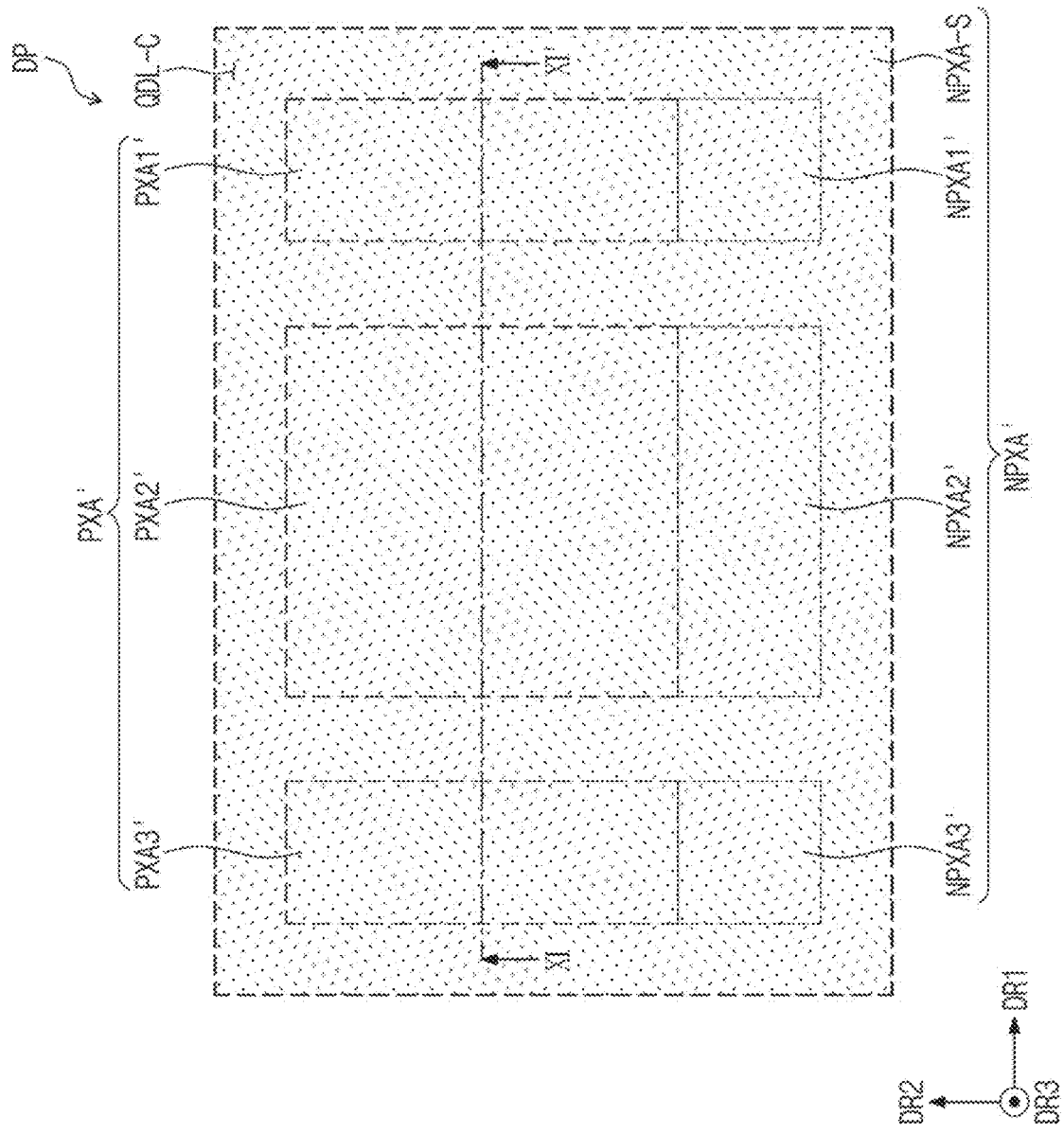
FIG. 14A is a plan view of a partial configuration of a display panel according to an embodiment of the inventive concept.
Figure 14B:
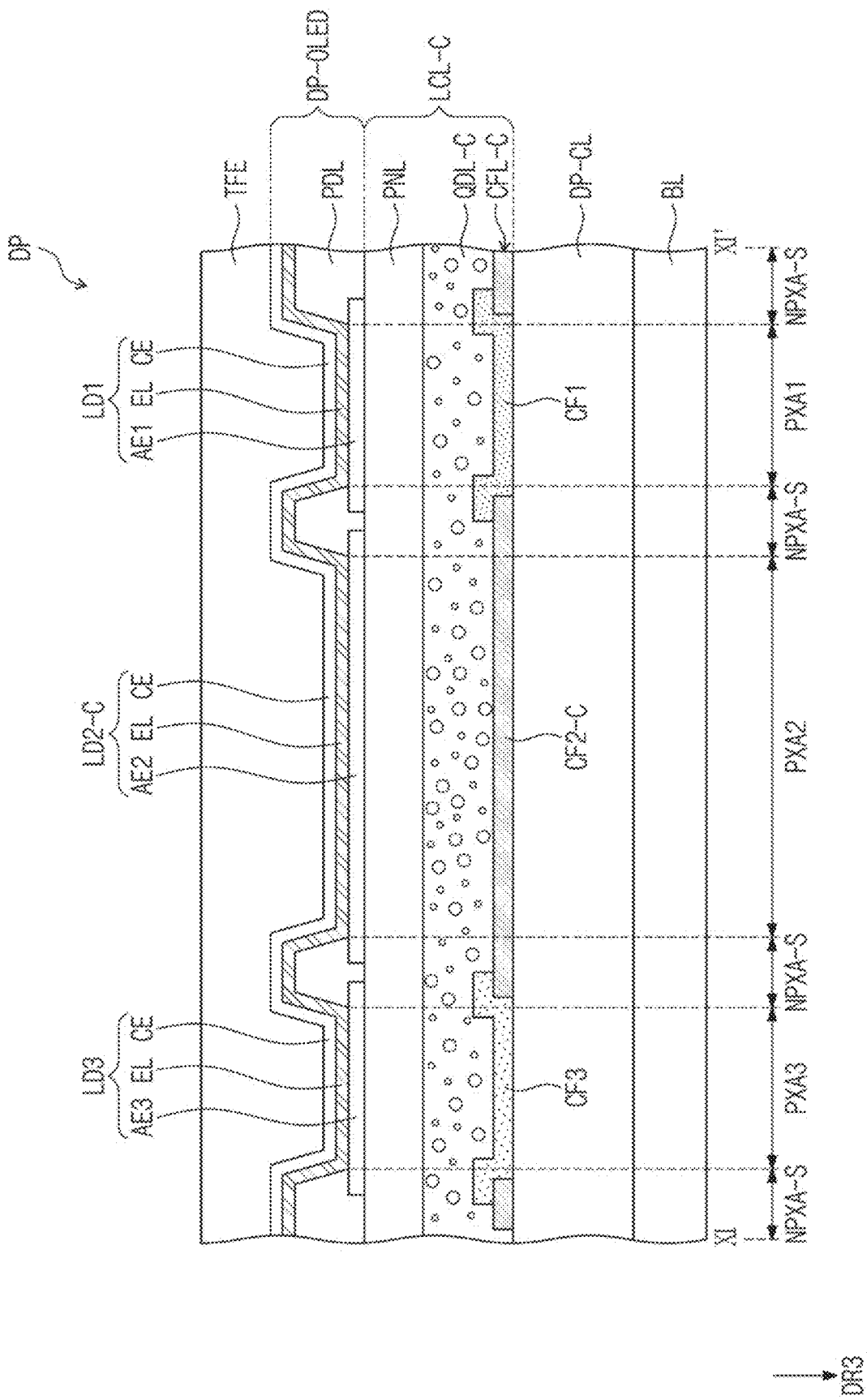
FIG. 14B is a cross-sectional view of a display panel according to an embodiment of the inventive concept, taken along line XI-XI' of FIG. 14A.

FIG. 14A is a plan view of a partial configuration of a display panel according to an embodiment of the inventive concept. FIG. 14B is a cross-sectional view of a display panel according to an embodiment of the inventive concept, taken along line XI-XI' of FIG. 14A. FIG. 14A illustrates a plane of a quantum dot layer QDL-C when the rear surface of a display panel DP is viewed.

Referring to FIGS. 14A and 14B, the quantum dot layer QDL-C according to an embodiment may include: quantum dots for converting at least a portion of source light into a wavelength range of first color light; and additional quantum dots for converting at least a portion of the source light into a wavelength range of third color light.

In the embodiment, light emitting regions PXA' may include first to third light emitting regions PXA1', PXA2', and PXA3'. The first to third light emitting regions PXA1', PXA2', and PXA3' may provide first to third color light, respectively. For example, the first color light may be red light, the second color light may be blue light, and the third color light may be green light.

The area of the second light emitting region PXA2' may be greater than the area of the first light emitting region PXA1' and the area of the third light emitting region PXA3'.

The quantum dot layer QDL-C may overlap the first to third light emitting regions PXA1', PXA2', and PXA3', first to third non-light emitting regions NPXA1', NPXA2', and NPXA3', and a peripheral non-light emitting region NPXA-S. Here, the quantum dot layer QDL-C overlaps the second light emitting region PXA2', and source light provided from a second light emitting element LD2-C is converted into wavelength ranges of the first and third color light. Accordingly, an amount of the second color light that passes through a second color filter CF2-C may be reduced. However, according to the embodiment, the amount of the second color light that passes through the second color filter CF2-C may be increased by increasing the area of the second light emitting region PXA2'.

Thus, a separate opening is not defined in the quantum dot layer QDL-C, and thus a process may be simplified. Also, a flat surface is provided on the entire surface of a display element layer DP-OLED, and thus the display panel DP having enhanced display quality may be provided. At the same time, the second color light is sufficiently provided, and thus the display panel DP having enhanced light emitting efficiency may be provided.

Figure 15:
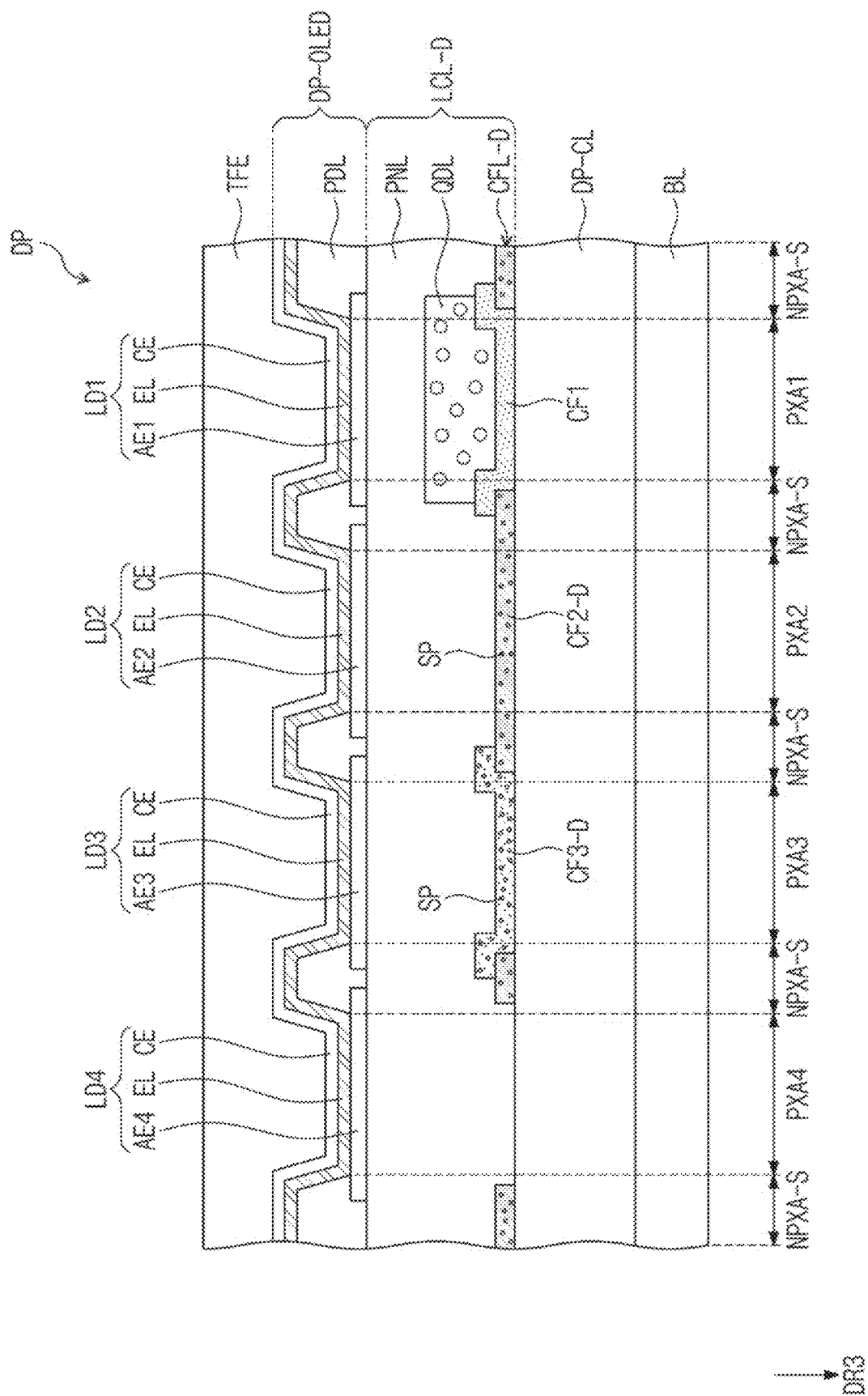
FIG. 15 is a cross-sectional view of a display panel according to an embodiment of the inventive concept.

FIG. 15 is a cross-sectional view of a display panel according to an embodiment of the inventive concept.

Referring to FIG. 15, a light control layer LCL-D according to an embodiment may include a color filter layer CFL-D, a quantum dot layer QDL, and a planarization layer PNL.

The color filter layer CFL-D may include first to third color filters CF1, CF2-D, and CF3-D which overlap first to third light emitting regions PXA1, PXA2, and PXA3, respectively.

In the embodiment, each of the second and third color filters CF2-D and CF3-D may further include scattering agents SP. The light incident to the second and third color filters CF2-D and CF3-D may be scattered in several directions by the scattering agents SP. The scattering agents SP may be particles that have relatively high density or specific gravity. For example, the scattering agents SP may include titanium oxide ($TiO_x$), silica-based nanoparticles, or the like.

The quantum dot layer QDL may overlap the first light emitting region PXA1. The quantum dot layer QDL may include quantum dots that convert at least a portion of source light, which is provided from a first light emitting element LD1, into a wavelength range of first color light.

According to the embodiment, the source light provided from the first light emitting element LD1 may be emitted out after being scattered in several directions by the quantum dots while passing through the quantum dot layer QDL. Also, source light provided from second and third light emitting elements LD2 and LD3 may be emitted out after being scattered in several directions by the scattering agents SP within the second and third color filters CF2-D and CF3-D while passing through the color filter layer CFL-D.

Therefore, first to third color light having similar degrees of scattering are provided to the first to third light emitting regions PXA1, PXA2, and PXA3, respectively, and thus properties such as luminance or a wide viewing angle may be similar to each other in the first to third light emitting regions PXA1, PXA2, and PXA3. Accordingly, the display device DD (see FIG. 1) having enhanced display quality may be provided.

Figure 16:
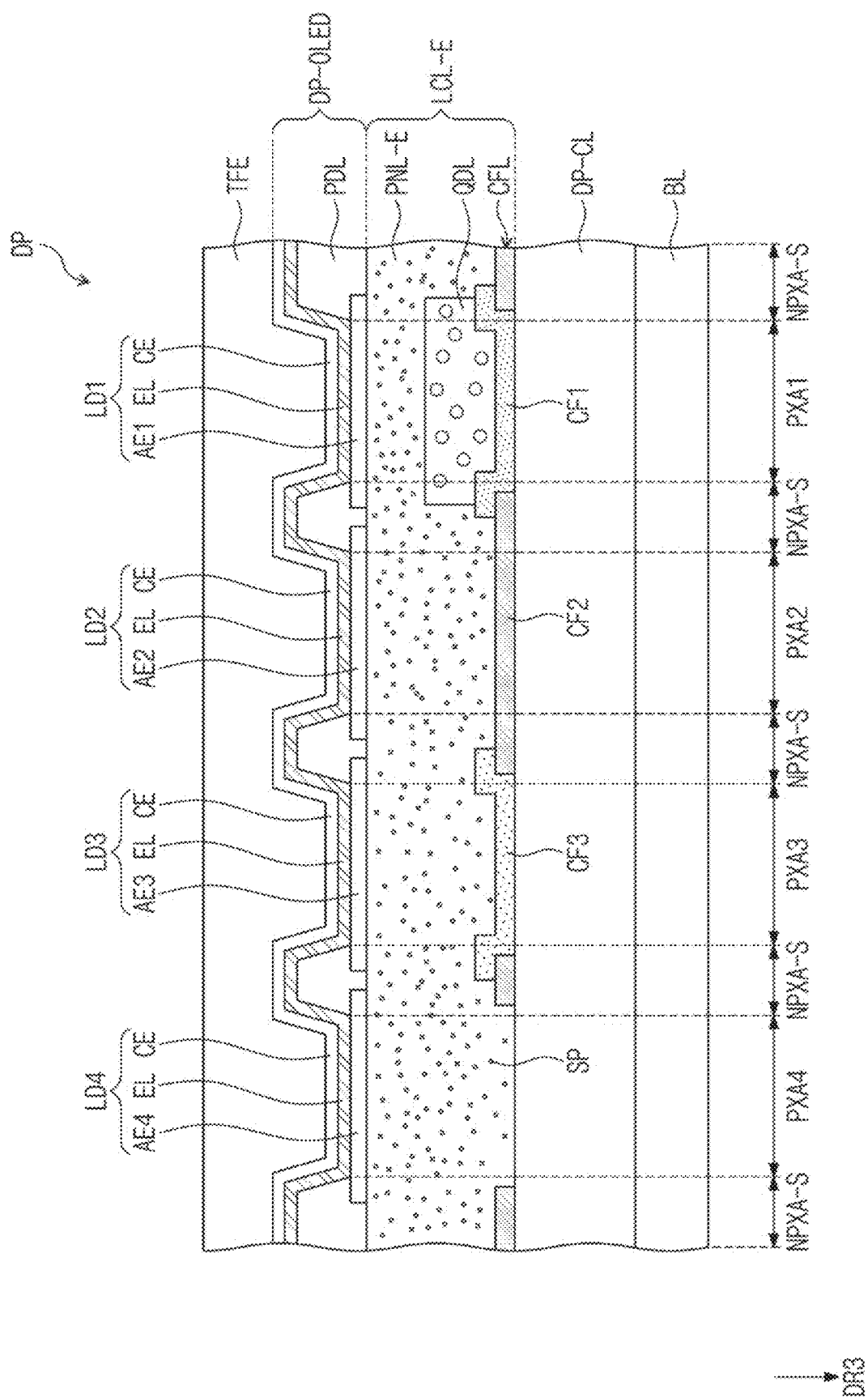
FIG. 16 is a cross-sectional view of a display panel according to an embodiment of the inventive concept.

FIG. 16 is a cross-sectional view of a display panel according to an embodiment of the inventive concept.

Referring to FIG. 16, a light control layer LCL-E according to an embodiment may include a color filter layer CFL, a quantum dot layer QDL, and a planarization layer PNL-E.

The color filter layer CFL may include first to third color filters CH, CF2, and CF3 which overlap first to third light emitting regions PXA1, PXA2, and PXA3, respectively.

The quantum dot layer QDL may overlap the first light emitting region PXA1. The quantum dot layer QDL may include quantum dots that convert at least a portion of source light, which is provided from a first light emitting element LD1, into a wavelength range of first color light.

The planarization layer PNL-E may be located between a circuit element layer DP-CL and a display element layer DP-OLED and cover the color filter layer CFL and the quantum dot layer QDL. In the embodiment, the planarization layer PNL-E may include an organic material and scattering agents SP dispersed in the organic material.

Source light provided from a first light emitting element LD1 may be emitted out, after being scattered in several directions by the scattering agents SP while passing through the planarization layer PNL-E and then scattered in several directions by the quantum dots while passing through the quantum dot layer QDL.

Source light provided from second to fourth light emitting elements LD2, LD3, and LD4 may be emitted out after being scattered in several directions by the scattering agents SP while passing through the planarization layer PNL-E.

Therefore, light having similar degrees of scattering are provided to the first to fourth light emitting regions PXA1, PXA2, PXA3, and PXA4, respectively, and thus properties such as luminance or a wide viewing angle may be similar to each other in the first to fourth light emitting regions PXA1, PXA2, PXA3, and PXA4. Accordingly, the display device DD (see FIG. 1) having enhanced display quality may be provided.

Figure 17:
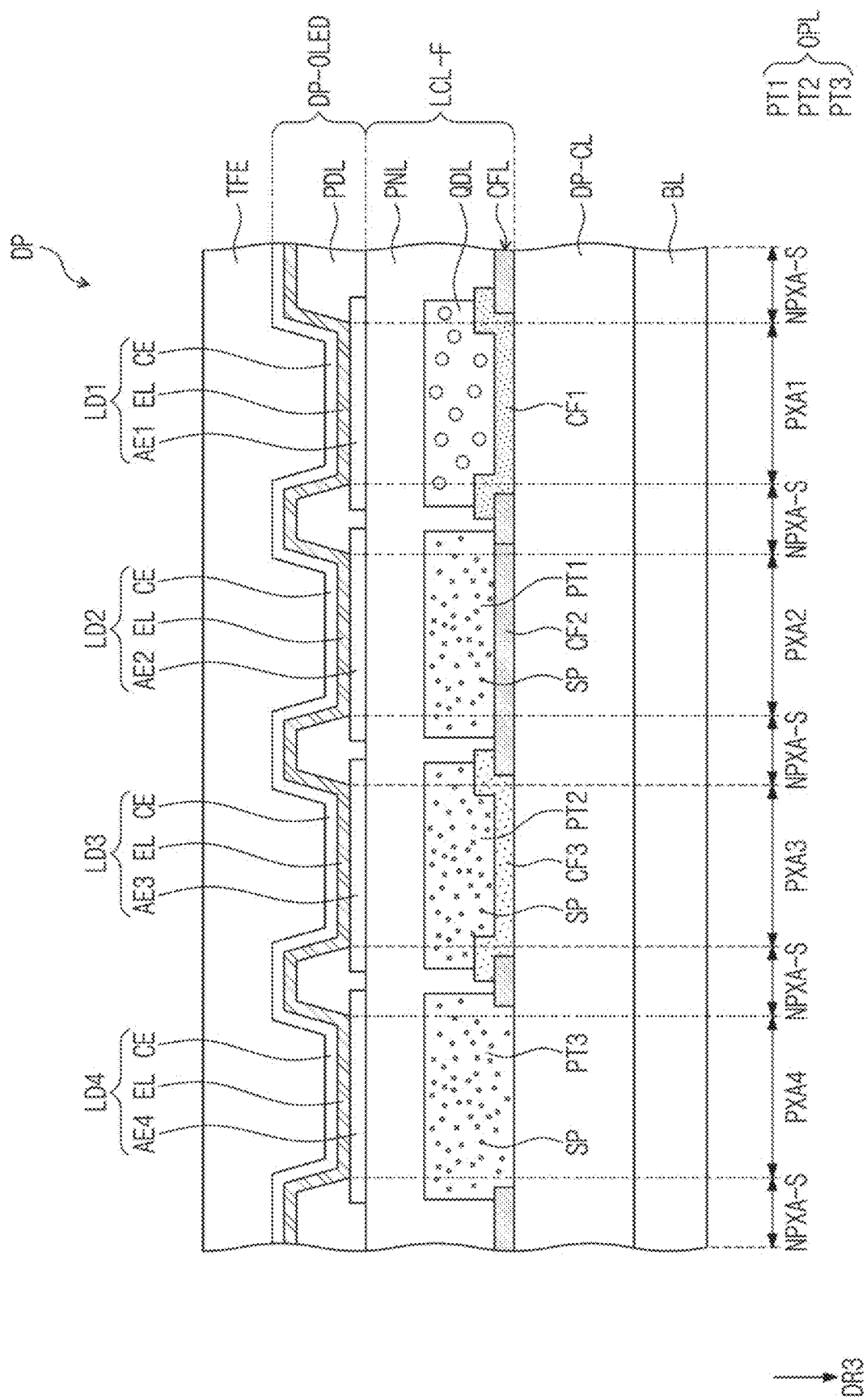
FIG. 17 is a cross-sectional view of a display panel according to an embodiment of the inventive concept.

FIG. 17 is a cross-sectional view of a display panel according to an embodiment of the inventive concept.

Referring to FIG. 17, a light control layer LCL-F according to an embodiment may include a color filter layer CFL, a quantum dot layer QDL, an organic pattern layer OPL, and a planarization layer PNL.

The color filter layer CFL may include first to third color filters CF1, CF2, and CF3 which overlap first to third light emitting regions PXA1, PXA2, and PXA3, respectively.

The quantum dot layer QDL may overlap the first light emitting region PXA1. The quantum dot layer QDL may include quantum dots that convert at least a portion of source light, which is provided from a first light emitting element LD1, into a wavelength range of first color light.

In the embodiment, the organic pattern layer OPL may include a first organic pattern PT1, a second organic pattern PT2, and a third organic pattern PT3. The first organic pattern PT1 may overlap the second light emitting region PXA2 and be disposed on the second color filter CF2 exposed from the quantum dot layer QDL. The second organic pattern PT2 may overlap the third light emitting region PXA3 and be disposed on the third color filter CF3 exposed from the quantum dot layer QDL. The third organic pattern PT3 may overlap the fourth light emitting region PXA4 and be disposed on a fourth insulating layer 40 (see FIG. 6) of a circuit element layer DP-CL.

Each of the first to third organic patterns PT1, PT2, and PT3 may include an organic material and scattering agents SP dispersed in the organic material. The organic material may be transparent and may include, for example, an acryl-based resin.

The planarization layer PNL may be located between the circuit element layer DP-CL and a display element layer DP-OLED and cover the color filter layer CFL, the quantum dot layer QDL, and the organic pattern layer OPL.

The source light provided from the first light emitting element LD1 may be emitted out after being scattered in several directions by the quantum dots while passing through the quantum dot layer QDL. Source light provided from second to fourth light emitting elements LD2, LD3, and LD4 may be emitted out after being scattered in several directions by the scattering agents SP while passing through the organic pattern layer OPL. Therefore, the light having similar degrees of scattering may be provided to the first to fourth light emitting regions PXA1, PXA2, PXA3, and PXA4, respectively, and thus the display device DD (see FIG. 1) having enhance display quality may be provided.

According to the embodiment of the inventive concept, at least a portion of the source light provided from the light emitting element passes through the quantum dot layer and the color filter layer, and thus the light having the enhanced color purity and color reproducibility may be provided. Also, according to the embodiment of the inventive concept, the occurrence of stepped portions is minimized on the planarization layer on which light emitting elements are arranged, and thus the source light may be uniformly provided from the light emitting element. Accordingly, the display device having the enhanced display quality may be provided.

While the present disclosure has been described with reference to embodiments thereof, it will be apparent to those of ordinary skill in the art that various changes and modifications may be made thereto without departing from the scope and spirit of the following claims.

What is claimed is:

1. A display device comprising:
   a base layer which comprises first, second, and third light emitting regions and a non-light emitting region that surrounds the first, second, and third light emitting regions;
   a display element layer which is disposed above the base layer and comprises first, second, and third light emitting elements that provide source light to the first, second, and third light emitting regions, respectively, toward the base layer;
   a circuit element layer which is disposed between the base layer and the display element layer and comprises first, second, and third pixel circuits that are connected to the first, second, and third light emitting elements, respectively, wherein the first, second, and third pixel circuits overlap the non-light emitting region and are spaced apart from the first, second, and third light emitting regions; and
   a light control layer which is disposed between the display element layer and the circuit element layer and comprises a color filter layer and a quantum dot layer,
   wherein the color filter layer comprises first, second, and third color filters that overlap the first, second, and third light emitting regions, respectively,
   wherein the quantum dot layer is disposed on the color filter layer, comprises quantum dots, and overlaps the first light emitting region and the first, second, and third pixel circuits.

2. The display device of claim 1, wherein the first, second, and third color filters allow first, second, and third color light having different colors to pass therethrough, respectively, and
   the quantum dots convert at least a portion of the source light, which is provided from the first light emitting element, into the first color light.

3. The display device of claim 2, wherein a control opening, which overlaps the second and third light emitting regions, is defined in the quantum dot layer.

4. The display device of claim 3, wherein the light control layer further comprises an organic pattern layer which is disposed on a region of the color filter layer exposed from the quantum dot layer, overlaps the second and third light emitting regions, and comprises an organic material and scattering agents dispersed in the organic material,
   wherein the organic pattern layer comprises:
   a first organic pattern overlapping the second light emitting region; and
   a second organic pattern overlapping the third light emitting region.

5. The display device of claim 2, wherein the first color light is any one of red light or green light.

6. The display device of claim 2, wherein the source light comprises the second and third color light.

7. The display device of claim 6, wherein the source light further comprises the first color light.

8. The display device of claim 2, wherein the quantum dot layer further comprises additional quantum dots that convert at least a portion of the source light, which is provided from the first light emitting element, into the third color light, and
   each of a wavelength of the first color light and a wavelength of the third color light is longer than a wavelength of the second color light.

9. The display device of claim 8, wherein the source light comprises the second color light.

10. The display device of claim 9, wherein the source light further comprises at least one of the first color light or the third color light.

11. The display device of claim 8, wherein the quantum dot layer overlaps the second and third light emitting regions.

12. The display device of claim 11, wherein an area of the second light emitting region is greater than an area of the first light emitting region and an area of the third light emitting region.

13. The display device of claim 11, wherein the quantum dot layer further comprises scattering agents.

14. The display device of claim 8, wherein the quantum dot layer overlaps the second light emitting region and does not overlap the third light emitting region.

15. The display device of claim 2, wherein the base layer further comprises a fourth light emitting region,
   the display element layer further comprises a fourth light emitting element that provides the source light to the fourth light emitting region toward the base layer,
   the circuit element layer further comprises a fourth pixel circuit which is connected to the fourth light emitting element and spaced apart from the fourth light emitting region and overlaps the non-light emitting region,
   the color filter layer does not overlap the fourth light emitting region, and
   the quantum dot layer overlaps the fourth pixel circuit.

16. The display device of claim 15, wherein a control opening, which overlaps the second to fourth light emitting regions, is defined in the quantum dot layer.

17. The display device of claim 16, wherein the quantum dot layer further comprises additional quantum dots that convert at least a portion of the source light, which is provided from the first light emitting element, into the third color light, and
the quantum dot layer overlaps the second to fourth light emitting regions.

18. The display device of claim 16, wherein the quantum dot layer further comprises additional quantum dots that convert at least a portion of the source light, which is provided from the first light emitting element, into the third color light, and
the quantum dot layer does not overlap the second and fourth light emitting regions.

19. The display device of claim 1, wherein the second color filter overlaps at least a portion of each of the first, second, and third pixel circuits.

20. The display device of claim 19, wherein at least one of the first or third color filter overlaps at least a portion of each of the first, second, and third pixel circuits and is disposed on the second filter in the non-light emitting region.

21. The display device of claim 1, wherein scattering agents are dispersed in at least one of the second or third color filter.

22. The display device of claim 1, wherein the light control layer further comprises a planarization layer disposed between the quantum dot layer and the display element layer, wherein the planarization layer covers the quantum dot layer and comprises an organic material.

23. The display device of claim 22, wherein the planarization layer further comprises scattering agents.

24. A display device comprising:
a base layer which comprises first, second, and third light emitting regions and a non-light emitting region that surrounds the first, second, and third light emitting regions;
a display element layer which is disposed above the base layer and comprises first, second, and third light emitting elements that provide source light to the first, second, and third light emitting regions, respectively, toward the base layer;
a circuit element layer which is disposed between the base layer and the display element layer and comprises first, second, and third pixel circuits that are connected to the first, second, and third light emitting elements, respectively, wherein the first, second, and third pixel circuits overlap the non-light emitting region and are spaced apart from the first, second, and third light emitting regions; and
a light control layer which is disposed between the display element layer and the circuit element layer and comprises a color filter layer and a quantum dot layer,
wherein the color filter layer comprises a first color filter overlapping the first light emitting region, a second color filter overlapping the second light emitting region and entirely overlapping the first, second, and third pixel circuits, and a third color filter overlapping the third light emitting region, and allow first, second, and third color light having different colors to pass therethrough, respectively,
wherein the quantum dot layer is disposed on the color filter layer, comprises quantum dots, and overlaps the first light emitting region,
wherein the quantum dots convert at least a portion of the source light, which is provided from the first light emitting element, into the first color light,
wherein the first color light is any one of red light or green light, and
wherein a control opening, which overlaps the second and third light emitting regions, is defined in the quantum dot layer.

25. The display device of claim 24, wherein the quantum dot layer further comprises additional quantum dots that convert at least a portion of the source light, which is provided from the first light emitting element, into the third color light,
a wavelength of the third color light is longer than a wavelength of the second color light, and
the quantum dot layer overlaps the second and third light emitting regions.

26. The display device of claim 24, wherein the quantum dot layer further comprises additional quantum dots that convert at least a portion of the source light, which is provided from the first light emitting element, into the third color light,
a wavelength of the third color light is longer than a wavelength of the second color light, and
the quantum dot layer overlaps the second light emitting region and does not overlap the third light emitting region.

27. The display device of claim 24, wherein at least one of the first or third color filter overlaps at least a portion of each of the first, second, and third pixel circuits and is disposed on the second color filter in the non-light emitting region.

28. A display device comprising:
a base layer which comprises first, second, and third light emitting regions and a non-light emitting region that surrounds the first, second, and third light emitting regions;
a display element layer which is disposed above the base layer and comprises first, second, and third light emitting elements that provide source light to the first, second, and third light emitting regions, respectively, toward the base layer;
a circuit element layer which is disposed between the base layer and the display element layer and comprises first, second, and third pixel circuits that are connected to the first, second, and third light emitting elements, respectively, wherein the first, second, and third pixel circuits overlap the non-light emitting region and are spaced apart from the first, second, and third light emitting regions; and
a light control layer which is disposed between the display element layer and the circuit element layer and comprises a color filter layer and a quantum dot layer,
wherein the color filter layer comprises a first color filter overlapping the first light emitting region, a second color filter overlapping the second light emitting region and entirely overlapping the first, second, and third pixel circuits, and a third color filter overlapping the third light emitting region, and
wherein the quantum dot layer is disposed on the color filter layer, comprises quantum dots, and overlaps the first light emitting region and at least a portion of each of the first, second, and third pixel circuits.

* * * * *